(12) United States Patent
Lin et al.

(10) Patent No.: US 10,776,053 B2
(45) Date of Patent: Sep. 15, 2020

(54) MEMORY CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/258,693

(22) Filed: Jan. 28, 2019

(65) Prior Publication Data

US 2020/0183623 A1 Jun. 11, 2020

(30) Foreign Application Priority Data

Dec. 5, 2018 (TW) .............................. 107143775 A

(51) Int. Cl.
*G06F 3/06* (2006.01)
*G11C 7/10* (2006.01)
*G06F 12/02* (2006.01)
*G06F 13/16* (2006.01)

(52) U.S. Cl.
CPC ........ *G06F 3/0688* (2013.01); *G06F 12/0238* (2013.01); *G06F 13/1668* (2013.01); *G11C 7/1096* (2013.01)

(58) Field of Classification Search
CPC ............... G06F 3/0688; G06F 12/0238; G06F 13/1668; G11C 7/1096
See application file for complete search history.

(56) References Cited

U.S. PATENT DOCUMENTS

| | | | |
|---|---|---|---|
| 2007/0260828 A1* | 11/2007 | Swaminathan | G06F 13/1668 711/154 |
| 2013/0208539 A1* | 8/2013 | Fujiu | G11C 16/06 365/185.03 |
| 2015/0169401 A1* | 6/2015 | Tseng | G06F 11/1068 714/773 |
| 2018/0268919 A1* | 9/2018 | Lee | G11C 29/028 |
| 2019/0138392 A1* | 5/2019 | Jung | G06F 11/1068 |
| 2020/0004629 A1* | 1/2020 | Zamir | G06F 3/0619 |

\* cited by examiner

*Primary Examiner* — Kevin Verbrugge
(74) *Attorney, Agent, or Firm* — JCIPRNET

(57) ABSTRACT

A memory control method for a rewritable non-volatile memory module is provided according to an exemplary embodiment of the disclosure. The method includes: reading first data from a first memory cell of the rewritable non-volatile memory module by a first read voltage level; decoding the first data by a decoding circuit; reading second data from the first memory cell by a second read voltage level; obtaining reliability information according to a first data status of the first data and a second data status of the second data, and the first data status and the second data status reflect that a first bit value of the first data is different from a second bit value of the second data; and decoding the second data by the decoding circuit according to the reliability information.

27 Claims, 11 Drawing Sheets

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 107143775, filed on Dec. 5, 2018. The entirety of the above-mentioned patent application is hereby incorporated by reference herein and made a part of this specification.

BACKGROUND

Technical Field

The disclosure relates to a memory control technology, and more particularly to a memory control method, a memory storage device, and a memory control circuit unit.

Description of Related Art

Digital cameras, mobile phones, and MP3 players have been growing very quickly in recent years, causing consumer demand for storage media to increase rapidly. Since a rewritable non-volatile memory module (e.g. a flash memory) has characteristics such as data non-volatile, power saving, small size, no mechanical structure, etc., the rewritable non-volatile memory module is very suitable to be built in the various portable multimedia devices exemplified above.

After the memory storage device has been in use for a period of time, the data read from the memory storage device may contain error bits. The read data may be decoded to correct the error bits therein before transferring such read data to the host system. In general, a memory controller may first decode data in a preset decoding mode (such as hard bit mode). In the hard bit mode, the memory controller may adjust the read voltage and reread data to try to reduce the number of error bits in the read data. If the error bits are too much and the situation cannot be solved by adjusting the read voltage (e.g., a retry count reaches a threshold), the memory controller may begin to read soft bit information of memory cells and use more complex decoding modes (such as soft bit mode) to correct errors in the read data. However, the hard bit mode and the soft bit mode are completely independent, and the information obtained in the hard bit mode is not passed to the soft bit mode. Therefore, the conventional decoding mechanism lacks efficiency in the switching of the decoding modes and in the transmission of the decoding information, and in some cases, the lifetime of the memory storage device may be shortened.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a memory control method, a memory storage device, and a memory management circuit, which are capable of improving a decoding capability of a decoding circuit and/or improving the performance of the memory storage device.

A memory control method for a rewritable non-volatile memory module which comprises a plurality of memory cells is provided according to an exemplary embodiment of the disclosure. The memory control method includes: reading first data from a first memory cell among the memory cells by a first read voltage level; decoding the first data by a decoding circuit; reading second data from the first memory cell by a second read voltage level which is different from the first read voltage level; obtaining reliability information corresponding to the first memory cell according to a first data status of the first data and a second data status of the second data, wherein the first data status and the second data status reflect that a first bit value of the first data is different from a second bit value of the second data; and decoding the second data by the decoding circuit according to the reliability information.

A memory storage device which includes a connection interface unit, a rewritable non-volatile memory module and a memory control circuit unit is provided according to an exemplary embodiment of the disclosure. The connection interface unit is configured to connect a host system. The rewritable non-volatile memory module includes a plurality of memory cells. The memory control circuit unit is coupled to the connection interface unit and the rewritable non-volatile memory module. The memory control circuit unit is configured to send a first read command sequence which instructs a reading of first data from a first memory cell among the memory cells by a first read voltage level. The memory control circuit unit is further configured to decode the first data. The memory control circuit unit is further configured to send a second read command sequence which instructs a reading of second data from the first memory cell by a second read voltage level which is different from the first read voltage level. The memory control circuit unit is further configured to obtain reliability information corresponding to the first memory cell according to a first data status of the first data and a second data status of the second data, wherein the first data status and the second data status reflect that a first bit value of the first data is different from a second bit value of the second data. The memory control circuit unit is further configured to decode the second data according to the reliability information.

A memory control circuit unit for controlling a rewritable non-volatile memory module which includes a plurality of memory cells is provided according to an exemplary embodiment of the disclosure. The memory control circuit unit includes a host interface, a memory interface, a decoding circuit and a memory management circuit. The host interface is configured to couple to a host system. The memory interface is configured to couple to the rewritable non-volatile memory module. The memory management circuit is coupled to the host interface, the memory interface and the decoding circuit. The memory management circuit is configured to send a first read command sequence which instructs a reading of first data from a first memory cell among the memory cells by a first read voltage level. The decoding circuit is configured to decode the first data. The memory management circuit is further configured to send a second read command sequence which instructs a reading of second data from the first memory cell by a second read voltage level which is different from the first read voltage level. The memory management circuit is further configured to obtain reliability information corresponding to the first memory cell according to a first data status of the first data and a second data status of the second data, wherein the first data status and the second data status reflect that a first bit value of the first data is different from a second bit value of the second data. The decoding circuit is further configured to decode the second data according to the reliability information.

Based on the above, after the first data obtained by reading the first memory cell via the first read voltage level is decoded, the second data may be read from the first memory cell by the second read voltage level. The reliability information may be obtained according to the first data status of the first data and the second data status of the second data. Particularly, the first data status and the second data status may reflect that the first bit value of the first data is different from the second bit value of the second data. Then, the decoding circuit may decode the second data based on the reliability information. Therefore, the decoding capability of the decoding circuit and/or the performance of the memory storage device may be improved.

To make the aforementioned and other features of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and may be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
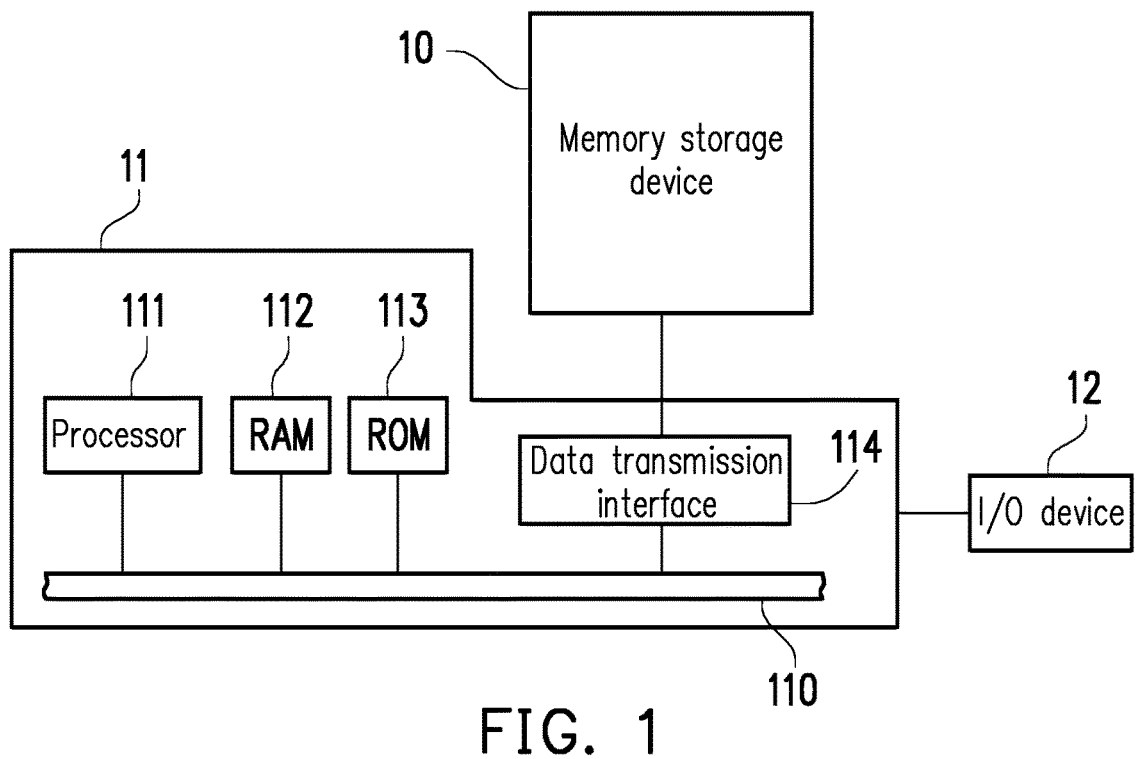
FIG. 1 is a schematic diagram of a host system, a memory storage device, and an input/output (I/O) device according to an exemplary embodiment of the disclosure.

Reference may now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (also referred to as a memory storage system) includes a rewritable non-volatile memory module and a controller (also referred to as a control circuit). The memory storage device is normally used together with a host system, allowing the host system to write data to the memory storage device or read data from the memory storage device.

Figure 2:
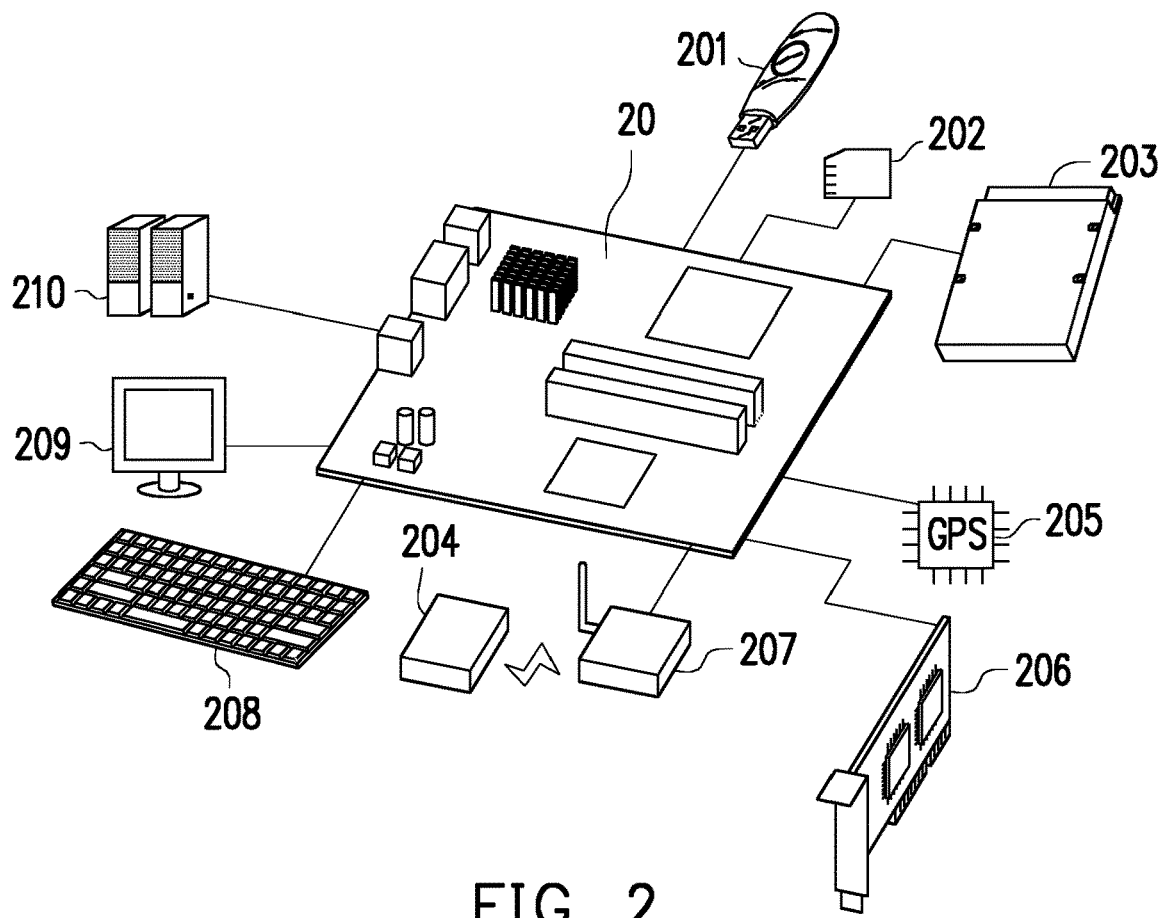
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2, a host system 11 normally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In the exemplary embodiment, the processor 111, the random access memory 112, the read-only memory 113, and the data transmission interface 114 may be disposed on a motherboard 20 of the host system 11. The number of data transmission interfaces 114 may be one or more. The motherboard 20 may be coupled to the memory storage device 10 via a wired or a wireless method through the data transmission interface 114. The memory storage device 10 may be, for example, a flash drive 201, a memory card 202, a Solid State Drive (SSD) 203, or a wireless memory storage device 204. The wireless memory storage device 204 may be, for example, a Near Field Communication (NFC) memory storage device, a wireless fidelity (WiFi) memory storage device, a Bluetooth memory storage device, a Bluetooth low energy (BLE) memory storage device (e.g. iBeacon), or other memory storage devices based on various types of wireless communication technologies. In addition, the motherboard 20 may also be coupled to a Global Positioning System (GPS) module 205, a network interface card 206, a wireless transmission device 207, a keyboard 208, a screen 209, a speaker 210, or other types of I/O devices through the system bus 110. For example, in an exemplary embodiment, the motherboard 20 may access the wireless memory storage device 204 through the wireless transmission device 207.

Figure 3:
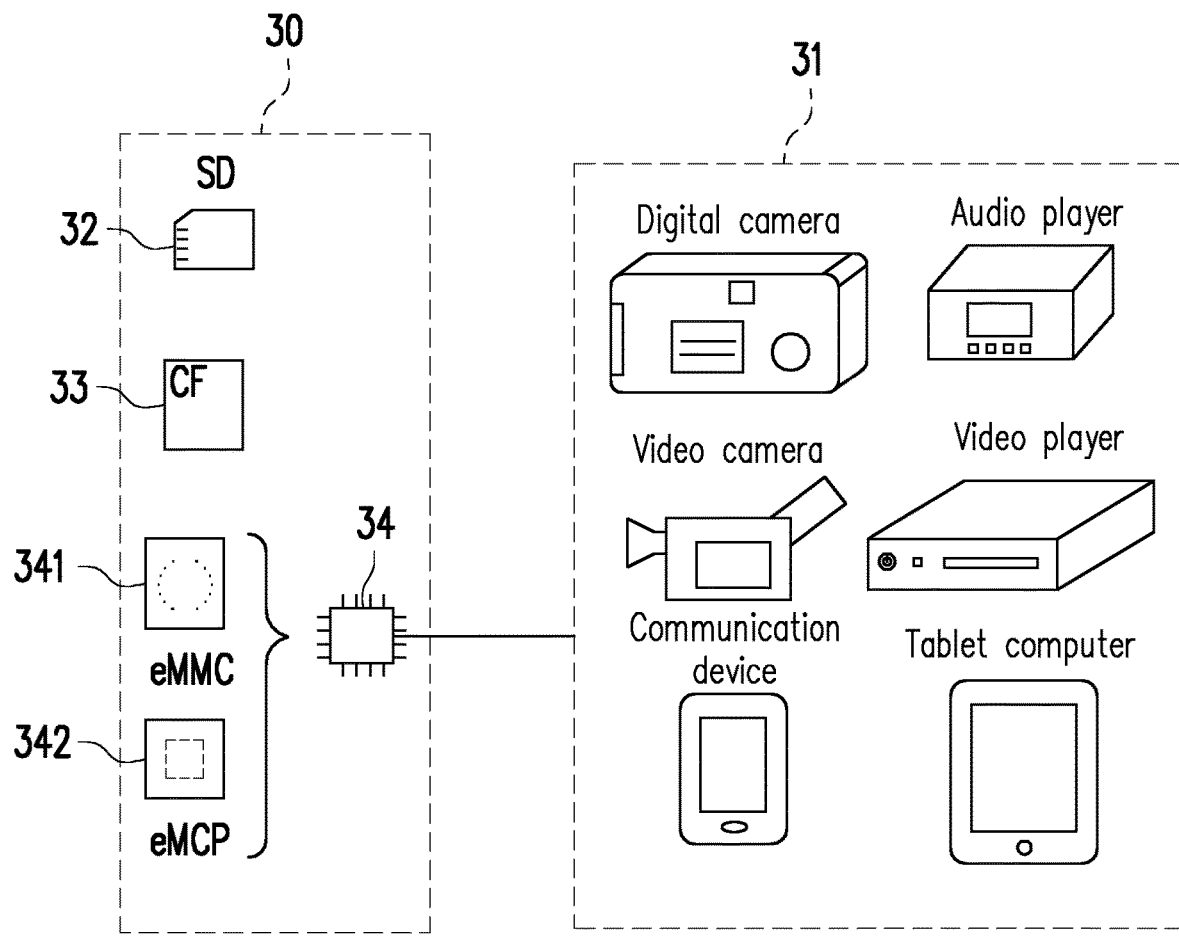
FIG. 3 is a schematic diagram of a host system and a memory storage device according to another exemplary embodiment of the disclosure.

In an exemplary embodiment, the host system mentioned may be any system that may substantially work with a memory storage device to store data. Although in the exemplary embodiments above, a computer system is used as the host system for illustration, FIG. 3 is a schematic diagram of a host system and a memory storage device according to another exemplary embodiment of the disclosure. Please refer to FIG. 3, in another exemplary embodiment, a host system 31 may also be a digital camera, a video camera, a communication device, an audio player, a video player, a tablet computer, or other systems. A memory storage device 30 may be a Secure Digital (SD) card 32, a Compact Flash (CF) card 33, an embedded storage device 34, or other types of non-volatile memory storage devices used by the host system 31. The embedded storage device 34 includes an embedded Multi Media Card (eMMC) 341, and/or an embedded Multi Chip Package (eMCP) storage device 342, or various types of embedded storage devices which directly couple a memory module onto a substrate of a host system.

Figure 4:
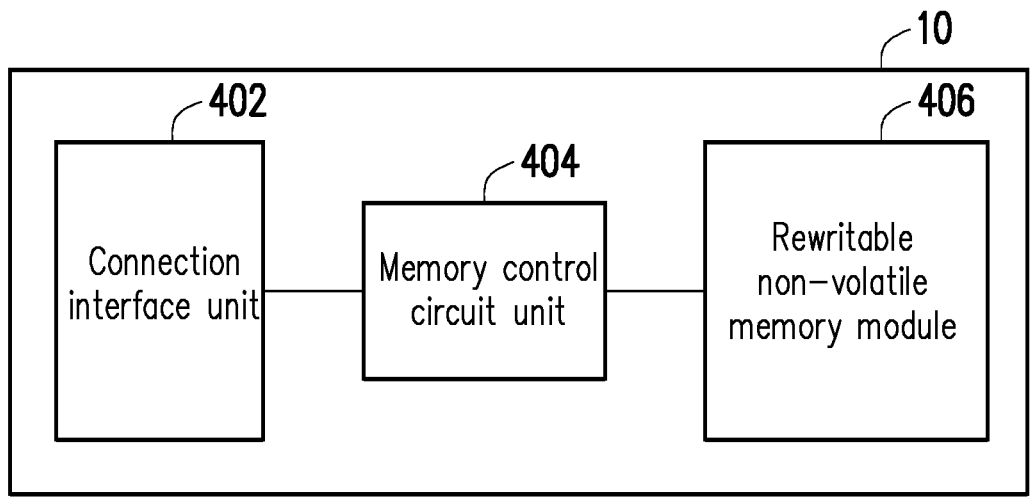
FIG. 4 is a functional block diagram of a memory storage device according to an exemplary embodiment of the disclosure.

FIG. 4 is a functional block diagram of a memory storage device according to an exemplary embodiment of the disclosure.

Please refer to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connect interface unit 402. In the exemplary embodiment, the connection interface unit 402 is compatible with the Serial Advanced Technology Attachment (SATA) standard. However, it must be understood that the disclosure is not limited thereto.

The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged in one chip with the memory control circuit unit 404 or the connection interface unit 402 may be disposed outside a chip containing the memory control circuit unit 404.

The memory control circuit unit 404 is configured to perform multiple logic gates or control commands implemented using a hardware type or a firmware type and execute operations such as writing, reading, and erasing of data in the rewritable non-volatile memory module 406 according to the command of the host system 11.

The rewritable non-volatile memory module 406 is coupled to the memory control circuit unit 404 and is configured to store data written by the host system 11. The rewritable non-volatile memory module 406 may be a Single Level Cell (SLC) NAND flash memory module (i.e., a flash memory module which stores 1-bit in one memory cell), a Multi Level Cell (MLC) NAND flash memory module (i.e., a flash memory module which stores 2-bits in one memory cell), a Triple Level Cell (TLC) NAND flash memory module (i.e., a flash memory module which stores 3-bits in one memory cell), a Quad Level Cell (QLC) NAND flash memory module (i.e., a flash memory module which stores 4-bits in one memory cell), other flash memory modules, or other memory modules with the same characteristic.

Each memory cell of the rewritable non-volatile memory modules 406 stores one or more bits based on a change of voltage (also referred to as a threshold voltage hereinafter). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data into the memory cell" or "programming the memory cell". As the threshold voltage changes, each memory cell of the rewritable non-volatile memory module 406 has multiple storage states. Through applying a read voltage, the storage state to which a memory cell belongs may be determined, thereby obtaining one or more bits stored by the memory cell.

In the exemplary embodiment, the memory cells of the rewritable non-volatile memory module 406 constitute multiple physical programming units, and the physical programming units constitute multiple physical erasing units. Specifically, the memory cells on the same word line form one or more physical programming units. If each memory cell may store two bits or more than 2 bits, then the physical programming units on the same word line may at least be classified into a lower physical programming unit and an upper physical programming unit. For example, a Least Significant Bit (LSB) of a memory cell belongs to the lower physical programming unit while a Most Significant Bit (MSB) of a memory cell belongs to the upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the exemplary embodiment, the physical programming unit is the smallest unit of programming. That is, the physical programming unit is the smallest unit of write data. For example, the physical programming unit is a physical page or a physical sector. If the physical programming unit is a physical page, then the physical programming units normally include a data bit region and a redundancy bit region. The data bit region includes multiple physical sectors for storing user data while the redundancy bit region is for storing system data (e.g. management data such as error correction codes, etc.). In the exemplary embodiment, the data bit region contains 32 physical sectors, and the size of one physical sector is 512 bytes (B). However, in other exemplary embodiments, a data bit region may also contain 8, 16, a higher number, or a lower number of physical sectors, and the size of each physical sector may also be larger or smaller. On the other hand, the physical erasing unit is the smallest unit of erase. That is, each physical erasing unit includes the smallest number of memory cells erased together. For example, the physical erasing unit is a physical block.

Figure 5:
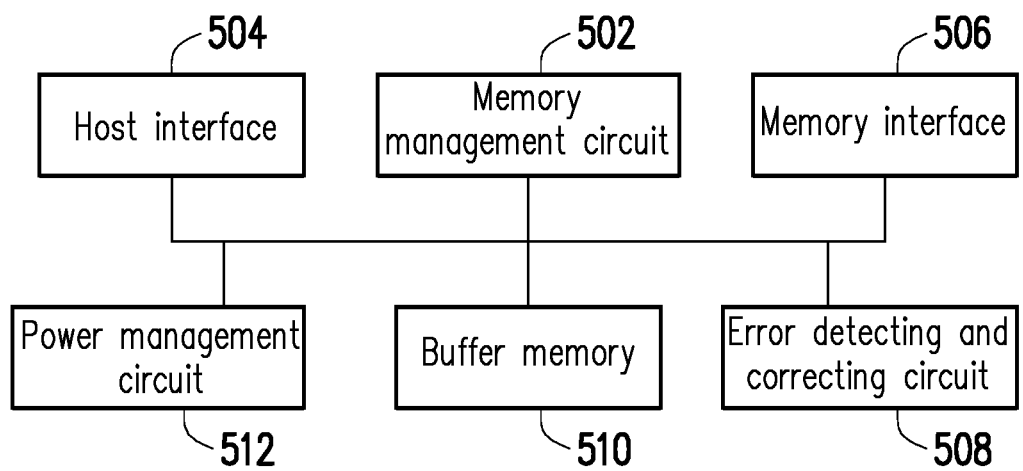
FIG. 5 is a functional block diagram of a memory control circuit unit according to an exemplary embodiment of the disclosure.

FIG. 5 is a functional block diagram of a memory control circuit unit according to an exemplary embodiment of the disclosure.

Please refer to FIG. 5, the memory control circuit unit 404 includes a memory management circuit 502, a host interface 504, a memory interface 506 and an error checking and correcting circuit 508.

The memory management circuit 502 is configured to control the overall operation of the memory control circuit unit 404. Specifically, the memory management circuit 502 has multiple control commands. When the memory storage device 10 operates, the control commands are performed to carry out operations such as writing, reading, and erasing of data. The illustration of operation of the memory management circuit 502 below may be equivalent to the illustration of operation of the memory control circuit unit 404.

In the exemplary embodiment, the control commands of the memory management circuit 502 are implemented using a firmware form. For example, the memory management circuit 502 has a microprocessor unit (not shown) and a read only memory (not shown), and the control commands are burnt into the read only memory. When the memory storage device 10 operates, the control commands are performed by the microprocessor unit to carry out operations such as writing, reading, and erasing of data.

In another exemplary embodiment, the control commands of the memory management circuit 502 may also be stored in a specific area of the rewritable non-volatile memory module 406 (e.g. a system area in the memory module dedicated to storage of system data) as a program code. In addition, the memory management circuit 502 has a microprocessor unit (not shown), a read only memory (not shown), and a random access memory (not shown). In particular, the read only memory has a boot code. When the memory control circuit unit 404 is enabled, the microprocessor unit first performs the boot code to load the control commands stored in the rewritable non-volatile memory module into the random access memory of the memory management circuit 502. Then, the microprocessor unit may run the control commands to carry out operations such as writing, reading, and erasing of data.

In addition, in another exemplary embodiment, the control commands of the memory management circuit 502 may also be implemented using a hardware form. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells of the rewritable non-volatile memory module 406 or a group thereof. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. The write command sequence, the read command sequence, and the erase command sequence may each include one or more program code or command code, and are for instructing the rewritable non-volatile memory module 406 to perform the corresponding write, read, erase, etc. operations. In an exemplary embodiment, the memory management circuit 502 may also issue other types of command sequences to the rewritable non-volatile memory module 406 to instruct performance of the corresponding operation.

The host interface 504 is coupled to the memory management circuit 502. The memory management circuit 502 may communicate with the host system 11 through the host interface 504. The host interface 504 is configured to receive and identify commands and data transmitted by the host system 11. For example, the commands and the data transmitted by the host system 11 are transmitted to the memory management circuit 502 through the host interface 504. Furthermore, the memory management circuit 502 may transmit data to the host system 11 through the host interface 504. In the exemplary embodiment, the host interface 504 is compatible with the SATA standard. However, it must be understood that the disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other standards suitable for data transmission.

The memory interface 506 is coupled to the memory management circuit 502 and is configured to access the rewritable non-volatile memory module 406. In other words, the data to be written to the rewritable non-volatile memory module 406 is converted to a format acceptable to the rewritable non-volatile memory module 406 via the memory interface 506. Specifically, if the memory management circuit 502 is to access the rewritable non-volatile memory module 406, the memory interface 506 may transmit a corresponding command sequence. For example, the command sequences may include a write command sequence instructing a writing of data, a read command sequence instructing a reading of data, an erase command sequence instructing an erasing of data, and corresponding command sequences for instructing various types of memory operations (e.g. changing read voltage level, performing garbage collection operation, etc.). The command sequences are generated, for example, by the memory management circuit 502 and transmitted to the rewritable non-volatile memory module 406 through the memory interface 506. The command sequences may include one or more signals, or data on the system bus. The signals or data may include command codes or program codes. For example, in the read command sequence, information such as a read identification code, a memory address, etc. are included.

The error checking and correcting circuit 508 is coupled to the memory management circuit 502 and is configured to perform error checking and correcting operations to ensure correctness of data. Specifically, when the memory management circuit 502 receives a write command from the host system 11, the error checking and correcting circuit 508 may generate an error correcting code (ECC) and/or an error detecting code (EDC) for the data corresponding to the write command. The memory management circuit 502 may write the data corresponding to the write command and the corresponding error correcting code and/or error detecting code into the rewritable non-volatile memory module 406. Then, when the memory management circuit 502 reads data from the rewritable non-volatile memory module 406, the error correcting code and/or the error detecting code corresponding to the data are read simultaneously. The error checking and correcting circuit 508 may perform an error checking and correcting operation to the read data based on the error correcting code and/or error detecting code.

In an exemplary embodiment, the memory control circuit unit 404 further includes a buffer memory 510 and a power management circuit 512.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, the memory control circuit unit 404 of FIG. 4 is also referred to as a flash memory controller configured to control the flash memory module, and/or the memory management circuit 502 of FIG. 5 is also referred to as a flash memory management circuit.

Figure 6:
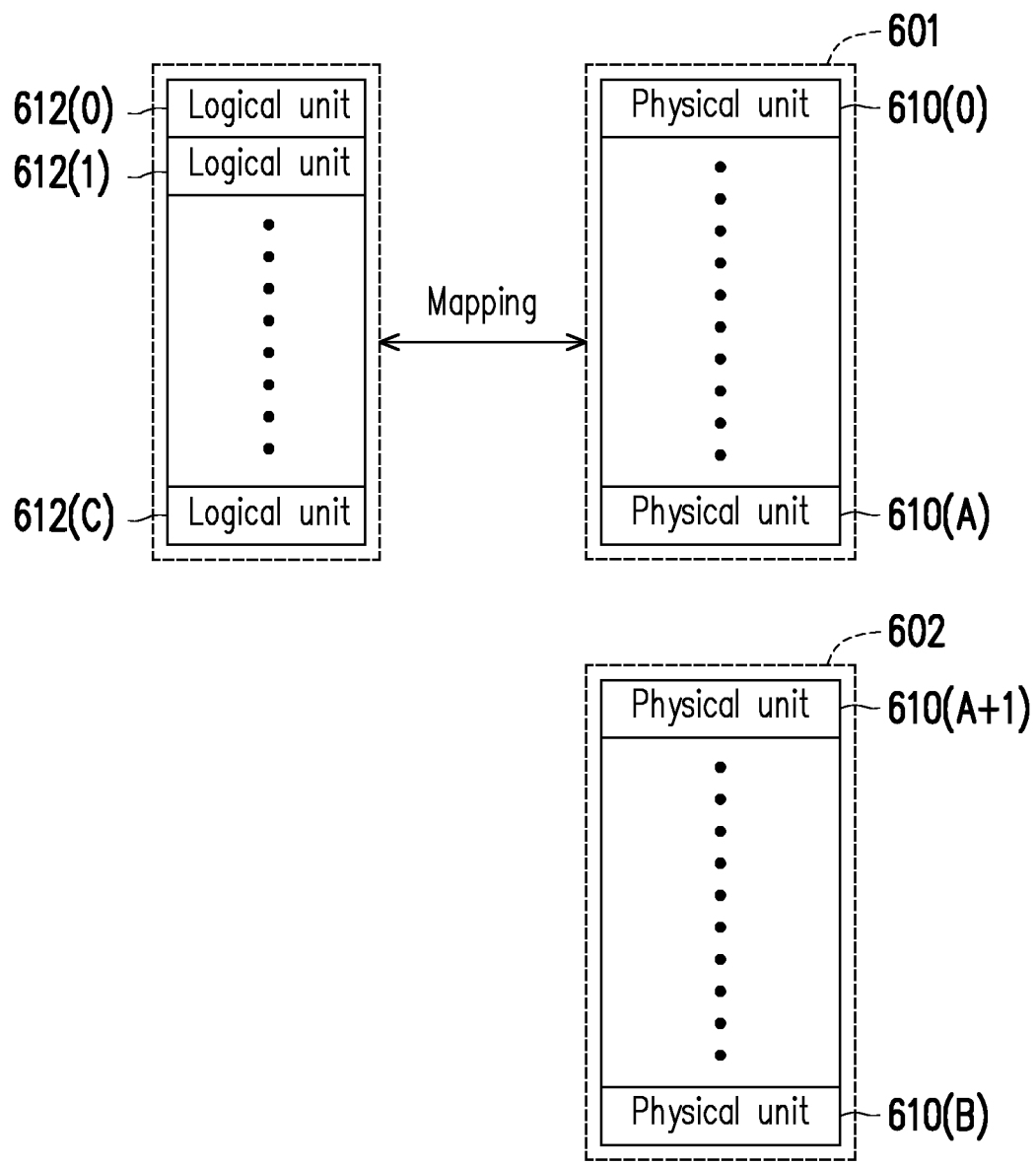
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure.

Please refer to FIG. 6, the memory management circuit 502 may logically group the physical units 610(0)-610(B) of the rewritable non-volatile memory module 406 into a storage area 601 and a replacement area 602. The physical units 610(0)-610(A) in the storage area 601 are configured to store data, and the physical units 610(A+1)-610(B) in the replacement area 602 are configured to replace damaged physical units in the storage area 601. For example, if data read from one specific physical unit includes too many errors and these errors cannot be corrected, the specific physical unit is regarded as a damaged physical unit. It is noted that, if there is no available physical erasing unit in the replacement area 602, the memory management circuit 502 may declare the memory storage device 10 as in a write protect state so data can no longer be written thereto.

In the exemplary embodiment, one physical unit is referred to as one physical programming unit. However, in another exemplary embodiment, one physical unit may also refer to one physical address, one physical erasing unit or a composition of a plurality of continuous or discontinuous physical addresses. The memory management circuit 502 may assign logical units 612(0)-612(C) for mapping to the physical units 610(0)-610(A) in the storage area 601. In the exemplary embodiment, one logical unit may refer to one logical address. However, in another exemplary embodiment, one logical unit may also refer to one logical programming unit, one logical erasing unit or a composition of a plurality of continuous or discontinuous logical addresses. In addition, one of the logical units 612(0)-612(C) may be mapped to one or more physical units.

The memory management circuit 502 may record a mapping relation (also referred to as a logical-physical address mapping relation) between the logical units and the physical units into at least one logical-physical address mapping table. When the host system 11 intends to read data from the memory storage device 10 or write data into the memory storage device 10, the memory management circuit 502 may perform a data accessing operation on the memory storage device 10 according to the logical-physical address mapping table.

The error checking and correcting circuit 508 may include one or more decoding circuits. In the exemplary embodiment, the error checking and correcting circuit 508 uses a low-density parity-check (LDPC) code. However, in another exemplary embodiment, the error checking and correcting circuit 508 may use a BCH code, a convolutional code, a turbo code, or the like.

It is noted that in the following description, some terms may be replaced with corresponding abbreviations for ease of reading (see Table 1).

TABLE 1

| rewritable non-volatile memory module | RNVM module |
| memory management circuit | MMC |
| error checking and correcting circuit | ECCC |
| physical unit | PU |
| read voltage level | RVL |

In the LDPC code, a valid codeword is defined by using a parity-check matrix. In the following, the parity-check matrix is labeled as a matrix H, and a codeword is labeled as CW. According to an equation (1) in the following, if a result of multiplication of the parity-check matrix H by the codeword CW is a zero vector, then the codeword CW is a valid codeword, wherein an operator $\otimes$ represents a mod 2 matrix multiplication. In other words, a null space of the matrix H includes all the valid codewords. However, the disclosure does not intend to limit contents of the codeword CW. For instance, the codeword CW may also include the ECC or the EDC generated by any algorithm.

$$H \otimes CW^T = 0 \qquad (1)$$

In the equation (1), a dimension of the matrix H is k-by-n, and a dimension of the codeword CW is 1-by-n, where k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n-k), and a dimension of the vector P is 1-by-k. Hereinafter, the message bits and the parity bits are collectively referred to as data bits. In other words, the codeword CW includes n data bits, in which a length of the message bits is (n-k) bits, a length of the parity bits is k bits, and a code rate of the codeword CW is (n-k)/n.

Generally, a generation matrix (labeled as G hereinafter) is used during encoding, so that an equation (2) below may be satisfied by arbitrary values of the vector M. In the equation (2), a dimension of the generation matrix G is (n-k)-by-n.

$$M \otimes G = [M \ P] = CW \qquad (2)$$

The codeword CW generated by the equation (2) is a valid codeword. Therefore, when the equation (2) is substituted into the equation (1), an equation (3) below may be obtained accordingly.

$$H \otimes G^T \otimes M^T = 0 \quad (3)$$

Since the vector M may be arbitrary vectors, an equation (4) below is definitely satisfied. In other words, after the parity check matrix H is decided, the corresponding generation matrix G may also be decided.

$$H \otimes G^T = 0 \quad (4)$$

When decoding the codeword CW, a parity check operation is firstly executed on the data bits in the codeword CW. For example, the parity check matrix H may be multiplied by the codeword CW to generate a vector (the vector is labeled as S in the following, as shown in an equation (5) below). If the vector S is the zero vector, the codeword CW may be directly output. If the vector S is not the zero vector, it is indicated that the codeword CW is not a valid codeword.

$$H \otimes CW^T = S \quad (5)$$

In the equation (5), a dimension of the vector S is k-by-1, in which each element is also referred to as a syndrome. If the codeword CW is not a valid codeword, the ECCC 508 may decode the codeword CW for attempting to correct the errors (i.e., the error bits) in the codeword CW.

Figure 7:
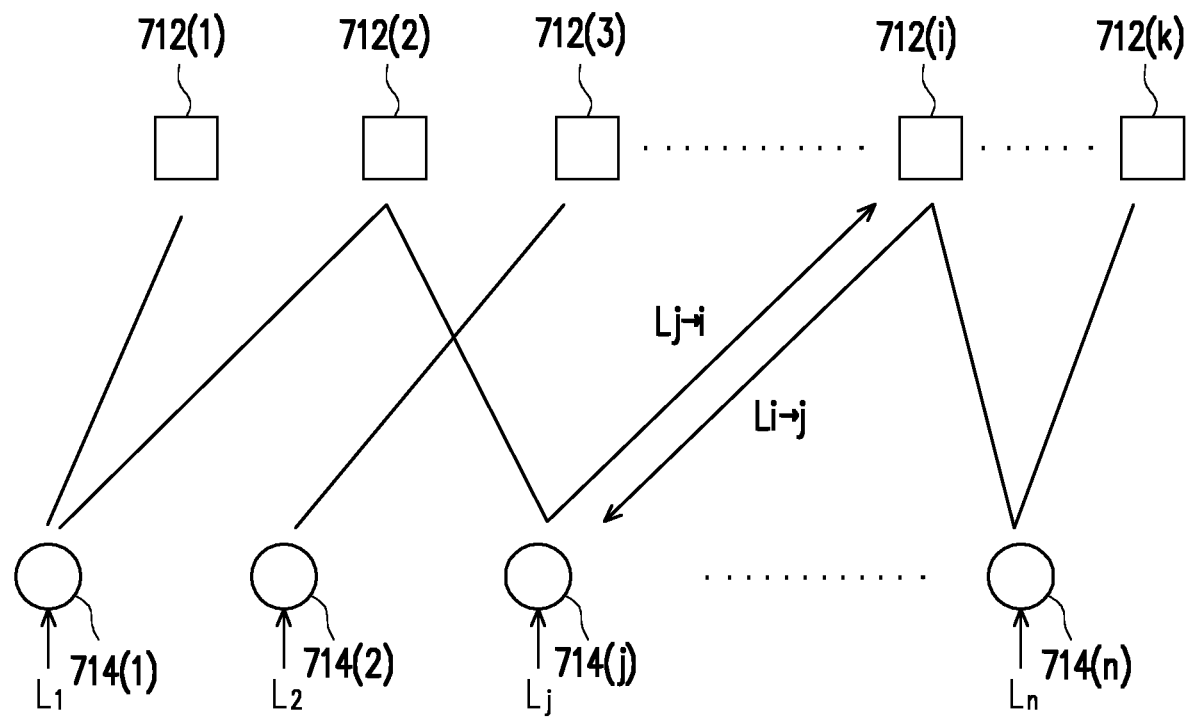
FIG. 7 is a schematic diagram illustrating a parity check matrix according to an exemplary embodiment of the disclosure.

FIG. 7 is a schematic diagram illustrating a parity check matrix according to an exemplary embodiment of the disclosure.

Referring to FIG. 7, in the exemplary embodiment, the parity-check matrix H may be represented as a bipartite graph 710. The bipartite graph 710 includes parity nodes 712(1)-712(k) and message nodes 714(1)-714(n). Each of the parity nodes 712(1)-712(k) corresponds to a syndrome, and each of the message nodes 714(1)-714(n) corresponds to a data bit. Corresponding relationships between the data bits and the syndromes (i.e., connections between the message nodes 714(1)-714(n) and the parity nodes 712(1)-712(k)) are generated according to the parity-check matrix. For example, if an element at the $i^{th}$ row and the $j^{th}$ column of the parity-check matrix is 1, the $i^{th}$ parity node 712(i) is connected to the $j^{th}$ message node 714(j), where i and j are positive integers.

When the MMC 502 reads n data bits (to form a codeword) from the RNVM module 406, the MMC 502 may also obtain reliability information (also referred to as channel reliability information) corresponding to each data bit. The reliability information represents a probability (also referred to as confidence level) that the corresponding data bit is decoded into the bit "1" or "0". In the bipartite graph 710, the message nodes 714(1)-714(n) also receive the corresponding reliability information. For example, the message node 714(1) may receive reliability information $L_1$ corresponding to the first data bit, and the message node 714(j) may receive reliability information $L_j$ corresponding to the $j^{th}$ data bit.

The ECCC 508 may perform the decoding operation based on the structure of the bipartite graph 710 and the reliability information $L_1$ to $L_n$. For example, the decoding operation includes iteration decoding. In the iteration decoding, the message nodes 714(1)-714(n) may calculate the reliability information for the parity nodes 712(1)-712(k), and the parity nodes 712(1)-712(k) may also calculate the reliability information for the message nodes 714(1)-714(n). The reliability information may be transmitted along edges in the bipartite graph 710. For example, the parity node 712(i) may transmit the reliability information $L_{i \to j}$ to the message node 714(j), and the message node 714(j) may transmit the reliability information $L_{j \to i}$ to the parity node 712(i). The reliability information represents the probability (i.e., the confidence level) that a data bit is decoded into "1" or "0" asserted by a node. For example, the reliability information $L_{j \to i}$ represents the confidence level (may be positive or negative) that the $j^{th}$ data bit is decoded into "1" or "0" asserted at the message node 714(j), and the reliability information $L_{j \to i}$ represents the confidence level that the $j^{th}$ data bit is decoded into "1" or "0" asserted at the parity node 712(i). The message nodes 714(1)-714(n) and the parity nodes 712(1)-712(k) may calculate the output reliability information based on the input reliability information. The calculation is similar to calculating of a conditional probability that a data bit is decoded into "1" or "0". Therefore, a process of transmitting the reliability information above is also referred to as a belief propagation.

In an exemplary embodiment, a log likelihood ratio (LLR) value is taken as an example of the reliability information. However, in response to different algorithms, different reliability information may be calculated by the message nodes 714(1)-714(n) and the parity nodes 712(1)-712(k). For example, the ECCC 508 may use a sum-product algorithm, a min-sum algorithm, a bit-flipping algorithm and so on, which is not limited by the disclosure.

In each iteration of the iteration decoding, the message nodes 714(1)-714(n) may transmit reliability information to the parity nodes 712(1)-712(k), and the parity nodes 712(1)-712(k) may transmit reliability information to the message nodes 714(1)-714(n). After each iteration, the message nodes 714(1)-714(n) may calculate whether one data bit should be decoded to be "1" or "0". Then, a parity-check operation may be performed on the calculated data bit. For example, in the parity-check operation, the codeword formed by the data bits may be multiplied with the parity check matrix. Accordingly, the generated codeword may be determined as a valid codeword or not a valid codeword. If the generated codeword is a valid codeword, it represents that the decoding is successful and the iteration decoding may be stopped. However, if the generated codeword is not a valid codeword, it represents the decoding is failed and a next iteration may be performed. In addition, if the number of iterations of the iteration decoding reaches a predetermined value, it may be determined that the decoding is failed and the iteration decoding may be stopped correspondingly.

Figure 8A:
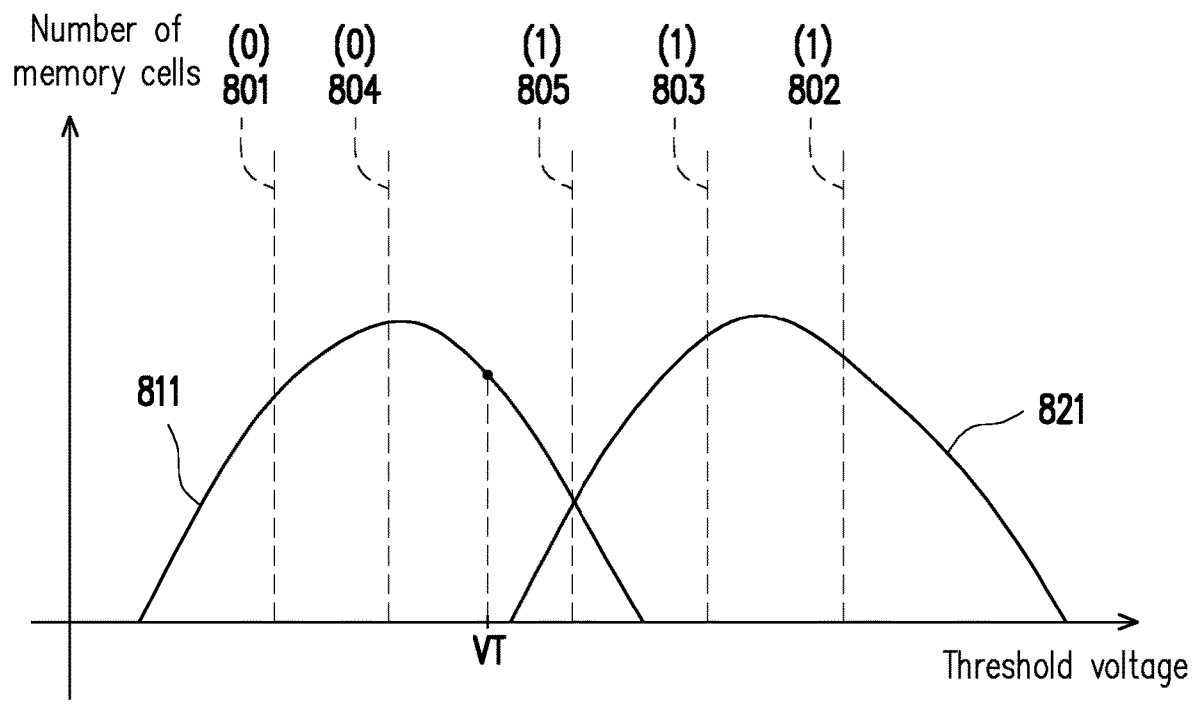
FIG. 8A is a schematic diagram of read voltage levels and threshold voltage distribution of memory cells according to an exemplary embodiment of the disclosure.

FIG. 8A is a schematic diagram of RVLs and threshold voltage distribution of memory cells according to an exemplary embodiment of the disclosure.

Referring to FIG. 8A, after a specific PU (also referred to as first PU) in the RNVM module 406 is programmed, a threshold voltage distribution of the memory cells in the first PU may include states 811 and 821. For example, the first PU may be one PU in the storage area 601 of FIG. 6. The state 811 reflects a correspondence relation between the number of memory cells storing a specific bit value and threshold voltages of these memory cells. The state 821 reflects a correspondence relation between the number of memory cells storing another specific bit value and threshold voltages of these memory cells. In the following exemplary embodiments, it is assumed that the state 811 corresponds to a bit value of "1", and the state 821 corresponds to a bit value of "0". However, in another exemplary embodiment, the state 811 may also correspond to the bit value of "0", and the state 821 may also correspond to the bit value of "1."

The MMC 502 may send a read command sequence which instructs a reading of data from the first PU by a RVL

801. The read command sequence may be generated based on a read command from the host system 11 or based on a data merge operation of the memory storage device 10. According to the read command sequence, the RNVM module 406 may read multiple memory cells in the first PU by using a default RVL (also referred to as initial RVL). In the exemplary embodiment, the RVL 801 is taken as an example of the default RVL. However, in another exemplary embodiment, the RVL 801 may also be higher or lower.

In the exemplary embodiment, one of the memory cells in the first PU is also referred to as a first memory cell. The memory cells read by the RVL 801 includes the first memory cell, and a threshold voltage of the first memory cell is assumed to be VT. However, in another exemplary embodiment, the threshold voltage of the first memory cell may also be higher or lower. Further, in the exemplary embodiment, it is assumed that the RVL 801 is less than the threshold voltage VT Therefore, data read from the first memory cell by the RVL 801 may include a bit value of "0".

The ECCC 508 may decode the data (also referred to as initial data) obtained by reading the first PU via the RVL 801. If the decoding is successful, the ECCC 508 may output the data which is successfully decoded. However, in the exemplary embodiment, it is assumed that the decoding for the initial data is failed. Therefore, the MMC 502 may enter a retry mode. In the retry mode, the MMC 502 may instruct the RNVM module 406 to adjust a RVL and update a retry count to "2" (assuming that an initial value of the retry count is "1"). Corresponding to the retry count which is "2", the MMC 502 may send a read command sequence which instructs a reading of data again from the first PU by the adjusted RVL. For example, the retry count of "2" indicates that two different RVLs has been used to read the first PU in the retry mode.

In the exemplary embodiment, the RVL 802 is taken as an example of the RVL corresponding to the retry count of "2", and the RVL 802 may be higher or lower. For example, corresponding to the retry count which is "2", the MMC 502 may send a read command sequence which instructs a reading of data again from the first PU by the RVL 802. The RVL 802 is different from the RVL 801. In the exemplary embodiment, it is assumed that the RVL 802 is higher than the threshold voltage VT. Therefore, the data read from the first memory cell by the RVL 802 may include a bit value of "1".

The ECCC 508 may decode the data obtained by reading the first PU via the RVL 802. If the decoding is successful, the ECCC 508 may output the data which is successfully decoded. However, in the exemplary embodiment, it is assumed that the decoding is failed. Therefore, in the retry mode, the MMC 502 may again instruct the RNVM module 406 to adjust the RVL and update the retry count to "3". Corresponding to the retry count which is "3", the MMC 502 may send a read command sequence which instructs a reading of data again from the first PU by the adjusted RVL. For example, the retry count of "3" means that three different RVLs has been used to read the first PU in the retry mode.

In the exemplary embodiment, a RVL 803 is taken as an example of the RVL corresponding to the retry count of "3", and the RVL 803 may be higher or lower. For example, corresponding to the retry count of "3", the MMC 502 may send a read command sequence which instructs a reading of data again from the first PU by the RVL 803. The RVL 803 is different from the RVLs 801 and/or 802. In the exemplary embodiment, it is assumed that the RVL 803 is higher than the threshold voltage VT. Therefore, the data read from the first memory cell by the RVL 803 may include a bit value of "1".

The ECCC 508 may decode the data read by the RVL 803. If the decoding is successful, the ECCC 508 may output the data which is successfully decoded. However, in the exemplary embodiment, it is assumed that the decoding is failed. Therefore, in the retry mode, the MMC 502 may again instruct the RNVM module 406 to adjust the RVL and update the retry count to "4". Corresponding to the retry count which is "4", the MMC 502 may send a read command sequence which instructs a reading of data again from the first PU by the adjusted RVL. For example, the retry count of "4" means that four different RVLs has been used to read the first PU in the retry mode.

In the exemplary embodiment, a RVL 804 is taken as an example of the RVL corresponding to the retry count of "4", and the RVL 804 may be higher or lower. For example, corresponding to the retry count of "4", the MMC 502 may send a read command sequence which instructs a reading of data again from the first PU by the RVL 804. The RVL 804 is different from the RVLs 801, 802 and/or 803. In the exemplary embodiment, it is assumed that the RVL 804 is less than the threshold voltage VT. Therefore, the data read from the first memory cell by the RVL 804 may include a bit value of "0".

The ECCC 508 may decode the data read by the RVL 804. If the decoding is successful, the ECCC 508 may output the data which is successfully decoded. However, in the exemplary embodiment, it is assumed that the decoding is failed. Therefore, in the retry mode, the MMC 502 may again instruct the RNVM module 406 to adjust the RVL and update the retry count to "5". Corresponding to the retry count which is "5", the MMC 502 may send a read command sequence which instructs a reading of data again from the first PU by the adjusted RVL. For example, the retry count of "5" means that five different RVLs has been used to read the first PU in the retry mode.

In the exemplary embodiment, a RVL 805 is taken as an example of the RVL corresponding to the retry count of "5", and the RVL 805 may be higher or lower. For example, corresponding to the retry count of "5", the MMC 502 may send a read command sequence which instructs a reading of data again from the first PU by the RVL 805. The RVL 805 is different from the RVLs 801, 802, 803, and/or 804. In the exemplary embodiment, it is assumed that the RVL 805 is greater than the threshold voltage VT. Therefore, the data read from the first memory cell by the RVL 805 may include a bit value of "1".

It is noted that, the MMC 502 may record the data status of data read from the first memory cell by the RVLs 801-805 in the retry mode. For example, the data status may reflect that the data read from the first memory cell by the RVLs 801-805 sequentially includes the bit values of "0", "1", "1", "0", and "1". Alternatively, from another perspective, the data status may reflect that the bit value (e.g., "0") of data read from the first memory cell by the RVLs 801 and 804 is different from the bit value (e.g., "1") of data read from the first memory cell by the RVLs 802, 803, and 805. According to the data status, the MMC 502 may obtain the reliability information corresponding to the first memory cell. Then, the ECCC 508 may decode the data according to the reliability information. For example, the data decoded according to the reliability information may include data read from the first PU (and/or the first memory cell) by the RVL 805.

It is noted that, the reliability information is determined according to the data status of the data read in real time from the first memory cell in the retry mode. Therefore, the reliability information may better correspond to a current status of the threshold voltage distribution of the memory cells, thereby improving the decoding success rate of data read from the memory cells having the same or similar threshold voltage distribution. Further, the voltage gaps between any two adjacent (i.e., neighboring) RVLs among the RVLs 801-805 of FIG. 8A may be the same or different.

In an exemplary embodiment of FIG. 8A, the voltage gaps between any two adjacent RVLs among the RVLs 801-805 may not be a preset value. For example, a voltage gap between the RVLs 801 and 804 adjacent to each other may be different from a voltage gap between the RVLs 804 and 805 adjacent to each other. Alternatively, the voltage gap between the RVLs 804 and 805 adjacent to each other may be different from a voltage gap between the RVLs 805 and 803 adjacent to each other.

In an exemplary embodiment, the MMC 502 may evaluate a voltage position of the first memory cell according to the data status. For example, according to the used RVLs 801-805 and the data status of the obtained data, the MMC 502 may roughly evaluate that the threshold voltage VT of the first memory cell is higher than the RVL 804 and/or lower than the RVL 805 (because the bit value of the first memory cell is changed between the RVLs 804 and 805). Alternatively, from another perspective, the MMC 502 may roughly evaluate that the threshold voltage VT of the first memory cell is closest to one of the RVLs 804 and 805 among the five RVLs 801-805 being applied thereto. Therefore, the MMC 502 may roughly determine the voltage position of the first memory cell according to one of the RVLs 804 and 805.

In an exemplary embodiment, the RVL 804 is also referred to as a first RVL, and the RVL 805 is also referred to as a second RVL. The MMC 502 may estimate that the voltage position of the first memory cell is located between the first RVL and the second RVL according to the data status. The MMC 502 may obtain the reliability information corresponding to first memory cell according to the estimated voltage position of the first memory cell. For example, the MMC 502 may select appropriate reliability information corresponding to this voltage position as the reliability information corresponding to the first memory cell. Thereby, the decoding success rate of the decoding circuit in the current and/or next decoding process may be increased by using the reliability information.

In an exemplary embodiment, the MMC 502 may select a specific RVL (also referred to as third RVL) as a basis and then obtain the reliability information corresponding to the first memory cell (also referred to as reliability information corresponding to the voltage position of the first memory cell) according to a voltage gap between the evaluated voltage position of the first memory cell and the third RVL. It is noted that, a read error rate corresponding to the third RVL is less than a read error rate corresponding to the first RVL. For example, a read error rate corresponding to a specific RVL may reflect a probability of an error bit presented in the data read by this specific RVL and/or a total number of error bits presented in the data read by this specific RVL. The higher the read error rate corresponding to a specific RVL, the higher the probability of the error bits being presented in the data read by this specific RVL is and/or the total number of error bits in data read by this specific RVL may be more. On the contrary, the higher the read error rate corresponding to a specific RVL, the lower the probability of the error bits being presented in the data read by this specific RVL is and/or the total number of error bits in data read by this specific RVL may be less.

In an exemplary embodiment, the MMC 502 may obtain the read error rate corresponding to a specific RVL according to a syndrome sum of data read by this specific RVL. For example, after data is read from the first PU by using one of the RVLs 801-805 of FIG. 8A, the ECCC 508 may perform a parity check operation on this data to obtain a corresponding vector S (also referred to as a syndrome vector). The ECCC 508 may accumulate the elements in this syndrome vector (i.e., the syndromes) to obtain the syndrome sum. The syndrome sum of specific data read by a specific RVL may reflect the read error rate corresponding to this RVL. For example, if the syndrome sum of data read by a specific RVL is smaller, then the read error rate corresponding to this RVL may be smaller.

The MMC 502 may compare the syndrome sums of different data read by the RVLs 801-805. The MMC 502 may select a RVL corresponding to the smallest syndrome sum from the RVLs 801 to 805 as the third RVL according to the comparison result. Taking FIG. 8A as an example, the data read by the RVL 805 has the smallest syndrome sum. In other words, it may be determined that the read error rate corresponding to the RVL 805 is smallest. Therefore, the MMC 502 may select the RVL 805 as the third RVL. In other words, in an exemplary embodiment of FIG. 8A, the RVL 805 may be used as both the second RVL and the third RVL.

Figure 8B:
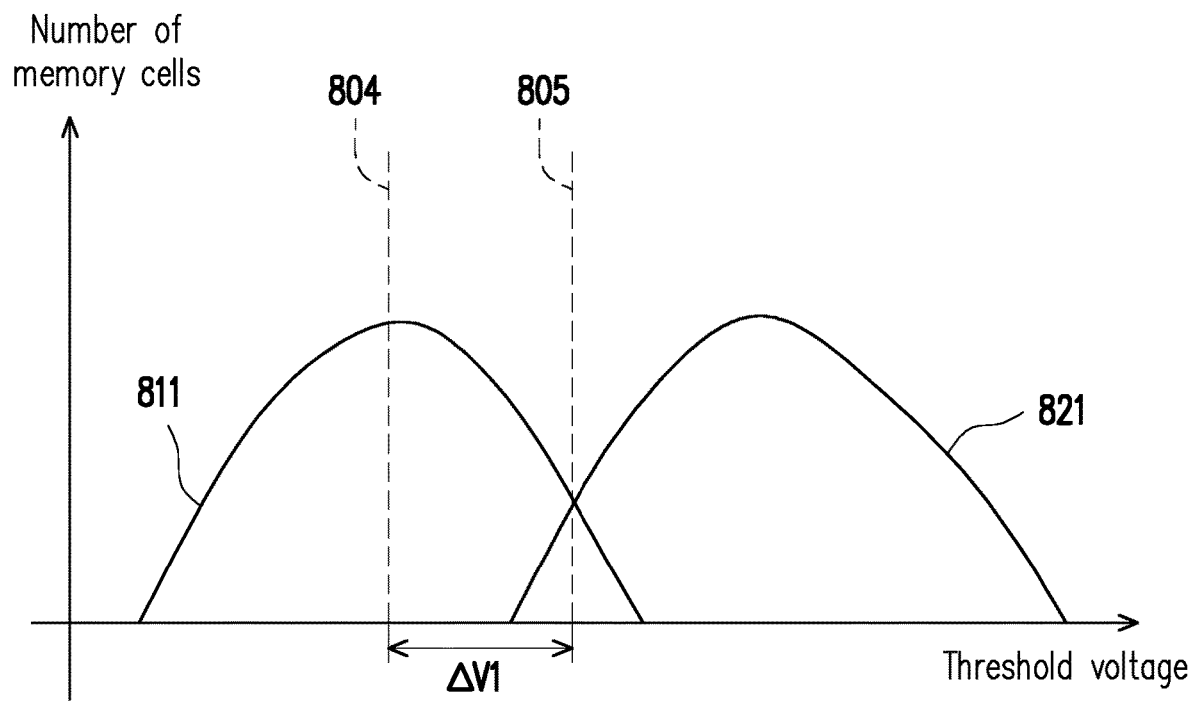
FIG. 8B is a schematic diagram of read voltage levels and threshold voltage distribution of memory cells according to an exemplary embodiment of the disclosure.

FIG. 8B is a schematic diagram of RVLs and threshold voltage distribution of memory cells according to an exemplary embodiment of the disclosure.

Referring to FIG. 8B, in an exemplary embodiment, the MMC 502 may obtain a voltage gap $\Delta V1$ between the RVLs 804 (i.e., the first RVL) and 805 (i.e., the third RVL). The voltage gap $\Delta V1$ reflects a difference value in voltage between the RVLs 804 and 805. On the other hand, the voltage gap $\Delta V1$ may also reflect a difference value between the reliability information corresponding to the RVL 804 (or reliability information corresponding to the voltage position of the first memory cell) and the reliability information corresponding to the RVL 805.

In an exemplary embodiment, the data read by the RVL 805 has a minimum syndrome sum, indicating that the read error rate corresponding to the RVL 805 is smallest. The MMC 502 may obtain the reliability information corresponding to the first memory cell according to the voltage gap $\Delta V1$ and the reliability information corresponding to the RVL 805. For example, the MMC 502 may adjust the reliability information corresponding to the RVL 805 according to the voltage gap $\Delta V1$, so as to obtain the reliability information corresponding to the first memory cell. The difference value between the reliability information corresponding to the first memory cell and the reliability information corresponding to the RVL 805 may be positively correlated to the voltage gap $\Delta V1$. For example, the MMC 502 may bring the voltage gap $\Delta V1$ and the reliability information corresponding to the RVL 805 into an algorithm or by looking up a table to obtain the reliability information corresponding to the first memory cell.

In an exemplary embodiment, third RVL may also be a RVL that is determined in advance and correspond to the smallest read error rate, and the third RVL may be different from the RVLs 801-805. For example, the third RVL may be located at a voltage position at where a least total number of memory cells locates in the threshold voltage distribution of FIG. 8A (similar to the voltage position of the RVL 805). In an exemplary embodiment, the third RVL may be obtained by a RVL tracking operation (also referred to as optimal RVL tracking). The RVL tracking operation may find (or search), for example, the voltage position with the least total number of memory cells in the threshold voltage distribution of FIG. 8A and then set a voltage level near this voltage position as the third RVL.

In an exemplary embodiment, the obtained reliability information corresponding to the first memory cell may be used to decode the data read from the first memory cell. In an exemplary embodiment, the obtained reliability information corresponding to the first memory cell is automatically determined in response to the evaluated voltage position of the first memory cell and the reliability information corresponding to the voltage position with the smallest read error rate. Therefore, the obtained reliability information corresponding to the first memory cell may effectively improve the decoding success rate of data read from the first memory cell.

In an exemplary embodiment, the MMC 502 may determine whether the retry count meets a specific condition (also referred to as a first condition). If the retry count does not meet the first condition, the MMC 502 may continuously adjust the RVLs in the retry mode and record the data status of data read by different RVLs. In addition, the ECCC 508 may continuously decode the data read in the retry mode. However, if the retry count meets the first condition, the MMC 502 may dynamically obtain the reliability information corresponding to the first memory cell according to the recorded data status. The ECCC 508 may decode data read from the first memory cell according to the dynamically obtained reliability information corresponding to the first memory cell.

In other words, in an exemplary embodiment, in the retry mode, only when the retry count meets the first condition, the MMC 502 may dynamically obtain the reliability information corresponding to the first memory cell according to the recorded data status and/or the ECCC 508 may decode the data read from the first memory cell based on the dynamically obtained reliability information corresponding to the first memory cell.

In an exemplary embodiment, the MMC 502 may determine whether the retry count meets another condition (also referred to as a second condition). If the retry count does not meet the second condition, the MMC 502 may keep the decoding operation in the retry mode and repeat the operations such as adjusting the RVLs. However, if the retry count meets the second condition, the MMC 502 may terminate or leave the retry mode. After leaving the retry mode, the MMC 502 and/or the ECCC 508 may perform default operations. The default operations may include any advanced error handling operations, such as using a more complex decoding algorithm and/or decoding circuit to decode data, looking up other tables to obtain other available RVLs for re-reading data, looking up other reliability information tables to obtain other reliability information for decoding data and/or reading other soft bit information for decoding data and so on.

In an exemplary embodiment, the first condition corresponds to a plurality of first threshold values, and the second condition corresponds to a second threshold value. Each of the first threshold values is less than the second threshold value. For example, the first threshold values may include values Q1, Q2, and Q3, etc., and the second threshold value may include a value P. In an exemplary embodiment, it is assumed that the values Q1, Q2, and Q3 are multiples of 5 such as "5", "10", and "15", respectively, and the value P is "60". Taking the example embodiments of FIG. 8A and FIG. 8B as an example, if the retry count is not greater than Q1 (for example, "5"), the RVLs 801-805 may be sequentially used to read the first PU and the ECCC 508 may sequentially (e.g., one by one) decode the data read by the RVLs 801-805. In addition, the data status of data read by the RVLs 801-805 may be recorded. If the retry count is equal to Q1, the reliability information corresponding to the first memory cell may be dynamically determined based on the recorded data status and the ECCC 508 may decode the data read from the first memory cell according to the dynamically determined reliability information.

Figure 9A:
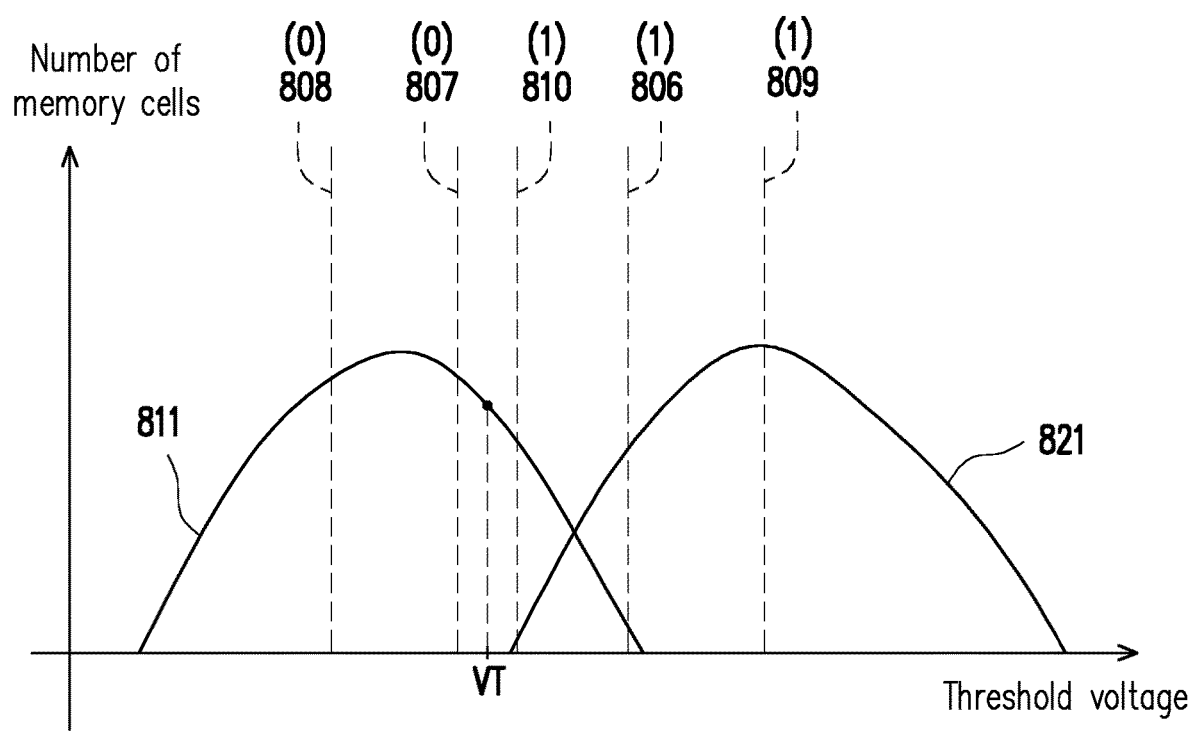
FIG. 9A and FIG. 9B are schematic diagrams of read voltage levels and threshold voltage distribution of memory cells according to an exemplary embodiment of the disclosure.
Figure 9B:
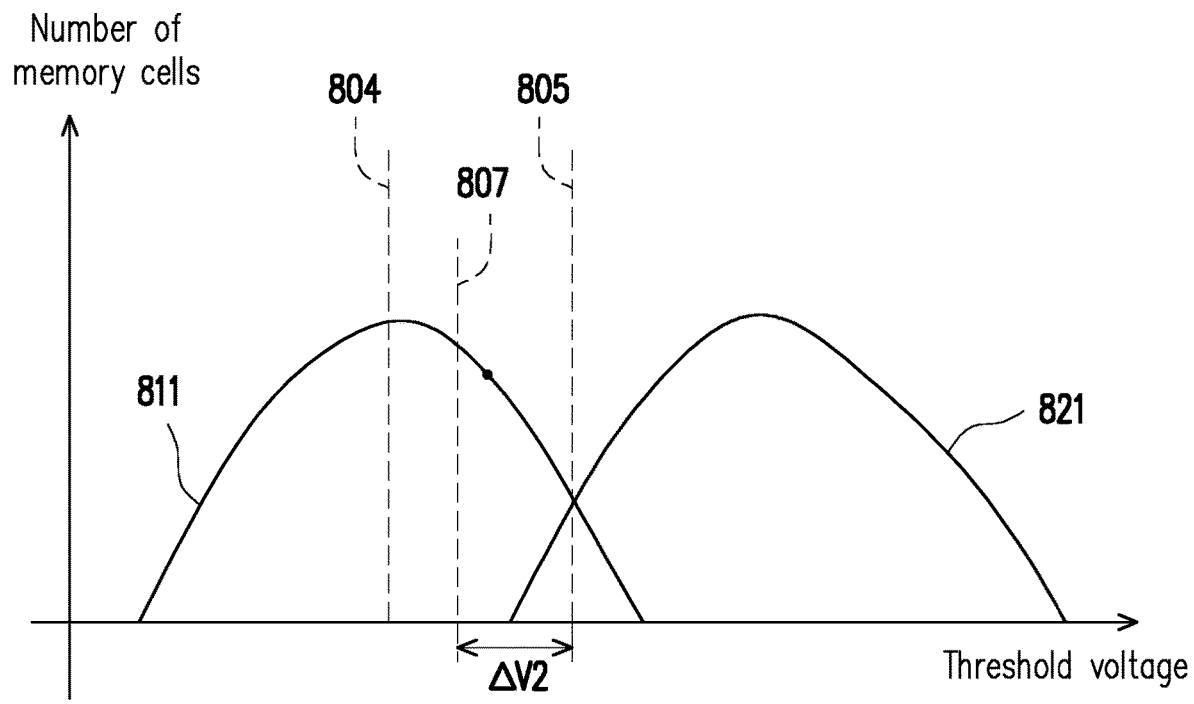

FIG. 9A and FIG. 9B are schematic diagrams of RVLs and threshold voltage distribution of memory cells according to an exemplary embodiment of the disclosure.

Referring to FIG. 9A and FIG. 9B, if the data read from the first memory cell (the first memory cell may be any memory cell in the first PU) cannot be successfully decoded by using the dynamically determined reliability information in the exemplary embodiments of FIG. 8A and FIG. 8B, the MMC 502 may instruct multiple readings of the first PU by using the RVLs 806-810 sequentially in the retry mode. The ECCC 508 may sequentially decode data read by the RVLs 806-810 until a decoding is successful. In addition, according to the RVLs 806-810, the retry count may be updated to "6"-"10" in sequence.

If the retry count is equal to Q2 (for example, 10), according to data status of data read from the first memory cell by the RVLs 806-810 (e.g., bit values "1", "0", "0", "1", "1") or data status of data read from the first memory cell by the RVLs 801-810, the RVL 807 or 810 may be determined as a RVL closet to the voltage position of the first memory cell. Taking the RVL 807 as an example, a voltage gap ΔV2 between the RVL 807 and RVL 805 (i.e., the third RVL) may be obtained. The MMC 502 may obtain the reliability information corresponding to the first memory cell according to the voltage gap ΔV2 and reliability information corresponding to the RVL 805. In other words, according to the reading result of the RVLs 806-810, the reliability information corresponding to the first memory cell may be updated. The voltage gap ΔV2 may be different from the voltage gap ΔV1. For example, the voltage gap ΔV2 may be less than the voltage gap ΔV1.

It is noted that, according to FIG. 8A, FIG. 8B, FIG. 9A and FIG. 9B, after using more (for example, 10) RVLs to read the first memory cell, the RVL 807 further closer to the threshold voltage VT of the first memory cell may be obtained to replace the RVL 804 which was previously considered as the closest to the threshold voltage VT of the first memory cell. Therefore, the reliability information updated according to the RVL 807 (and/or the voltage gap ΔV2) may be more consistent with the reliability information corresponding to the actual voltage position of the first memory cell. As such, using the reliability information updated again to decode the data read from the first memory cell may lead to a higher probability of decoding success. The details of the operations of the exemplary embodiments of FIG. 9A and FIG. 9B may be referred to the exemplary embodiments of FIG. 8A and FIG. 8B, and related details are not described herein. Further, the voltage gaps between any two adjacent RVLs among the RVLs 806-810 of FIG. 9A may be the same or different.

In an exemplary embodiment of FIG. 9A, the voltage gaps between any two adjacent RVLs among the RVLs 806-810 may not be a preset value. For example, a voltage gap between the RVLs 807 and 810 adjacent to each other may be different from a voltage gap between the RVLs 806 and 809 adjacent to each other. Alternatively, a voltage gap between the RVLs 807 and 810 adjacent to each other may be different from a voltage gap between the RVLs 810 and 806 adjacent to each other.

Figure 10A:
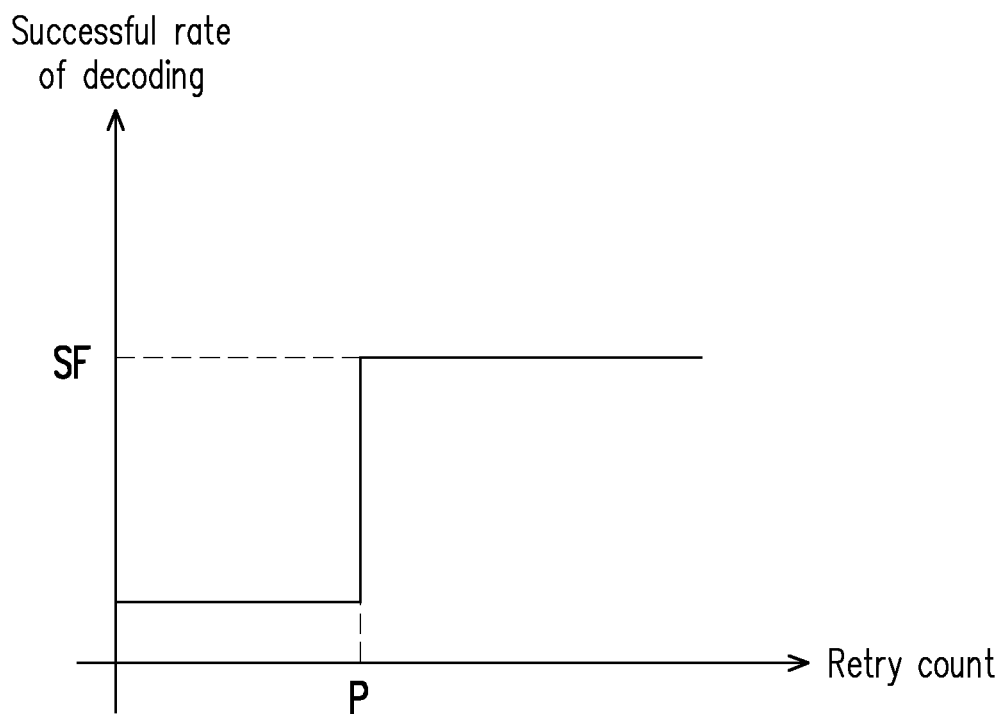
FIG. 10A is a schematic diagram of decoding efficiency of a decoding operation in traditional.

FIG. 10A is a schematic diagram of decoding efficiency of a decoding operation in traditional.

Referring to FIG. 10A, conventionally, it is assumed that a decoding circuit may repeatedly decode data read from a certain PU by different RVLs before a retry count reaches P. However, the decoding success rate of the decoding circuit may always be low until the retry count reaches P. After the retry count reaches P, the decoding circuit may leave the retry mode and enter a soft decoding mode (also referred to as soft bit decoding mode). After entering the soft decoding mode, more soft bit information for improving the decoding success rate may be obtained by applying more soft RVLs; however, the decoding success rate is always low before entering the soft decoding mode and the increasing of the decoding success rate is actually not high in the soft decoding mode (about at the decoding success rate SF).

Figure 10B:
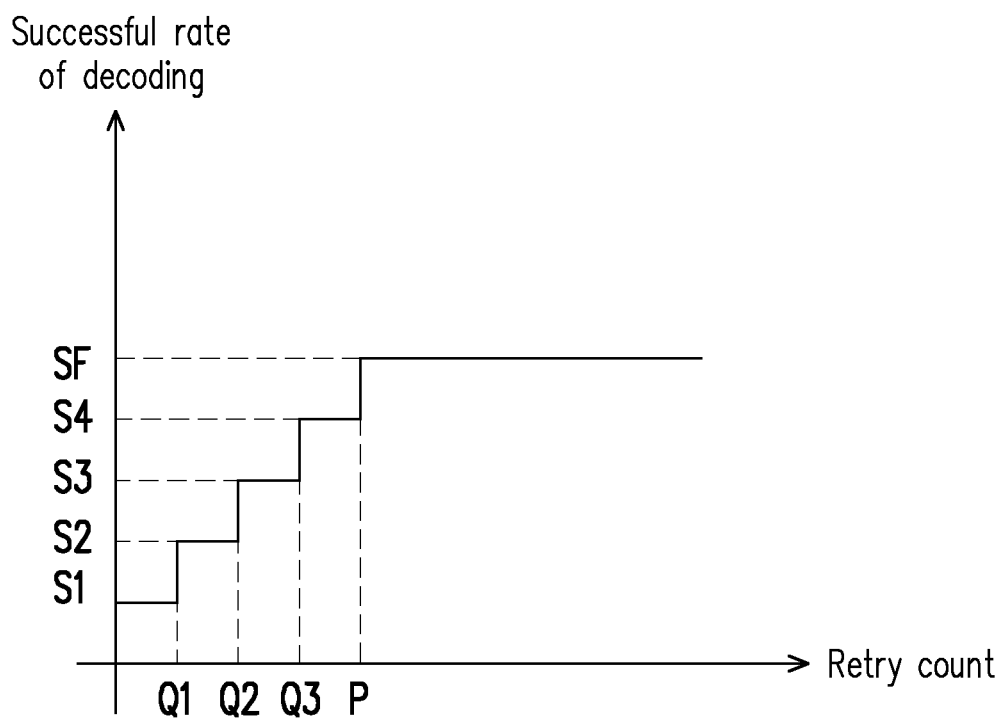
FIG. 10B is a schematic diagram of decoding efficiency according to an exemplary embodiment of the disclosure.

FIG. 10B is a schematic diagram of decoding efficiency according to an exemplary embodiment of the disclosure.

Referring to FIG. 10B, taking the exemplary embodiments of FIG. 8A and FIG. 9A as an example, when the retry count reaches Q1, the decoding success rate of the decoding circuit may rise from the original S1 to S2 based on the dynamically obtained reliability information. When the retry count reaches Q2, the decoding success rate of the decoding circuit may further rise to S3 based on the dynamically obtained reliability information. When the retry count reaches Q3, the decoding success rate of the decoding circuit may further rise to S4 based on the dynamically obtained reliability information. When the retry count reaches P, the decoding success rate of the decoding circuit may finally rise to SF based on the dynamically obtained reliability information. It is noted that, FIG. 10A and FIG. 10B are merely schematic diagrams, and the curves in FIG. 10A and/or FIG. 10B may vary in practice.

In other words, in an exemplary embodiment, the reliability information corresponding to one or more memory cell may be dynamically adjusted according to the data status of data continuously obtained in the retry mode. Comparing to the traditional way to start reading the soft bit information after entering the soft decoding mode (or leaving the retry mode), the exemplary embodiments of the present disclosure may increase the usage rate of the read data in the retry mode, and the decoding success rate of the decoding circuit may be gradually increased in the retry mode. Thereby, the performance of the memory storage device may also be effectively improved. In addition, the values Q1 to Q3 and P in the foregoing exemplary embodiments may be adjusted according to actual requirements, and the present disclosure is not limited.

Figure 11:
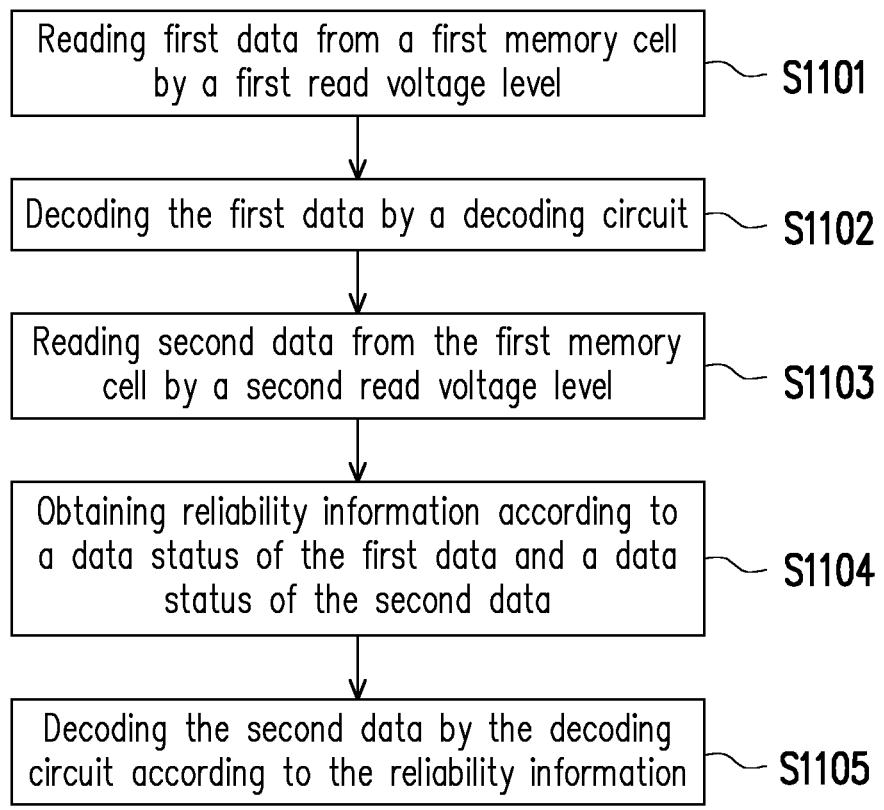
FIG. 11 is a flow chart of a memory control method according to an exemplary embodiment of the disclosure.

FIG. 11 is a flow chart of a memory control method according to an exemplary embodiment of the disclosure.

Referring to FIG. 11, in step S1101, first data is read from a first memory cell by a first RVL. In step S1102, the first data is decoded by a decoding circuit. In step S1103, second data is read from the first memory cell by a second RVL. The second RVL is different from the first RVL. In step S1104, reliability information is obtained according to a first data status of the first data and a second data status of the second data. For example, the first data status and the second data status reflect that a first bit value of the first data is different from a second bit value of the second data. In step S1105, the second data is decoded according to the reliability information by the decoding circuit.

Figure 12A:
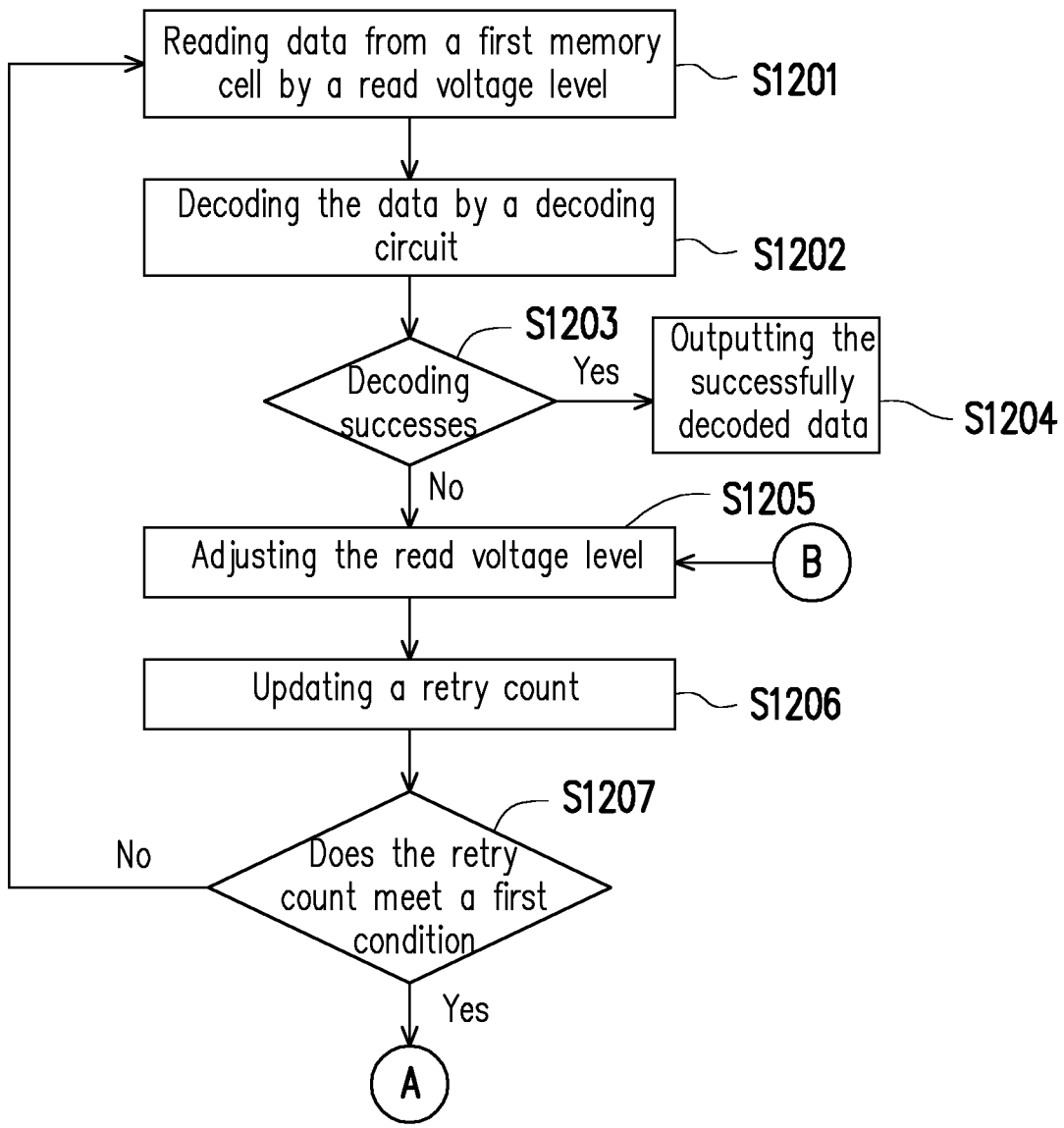
FIG. 12A and FIG. 12B are flow charts of a memory control method according to an exemplary embodiment of the disclosure.
Figure 12B:
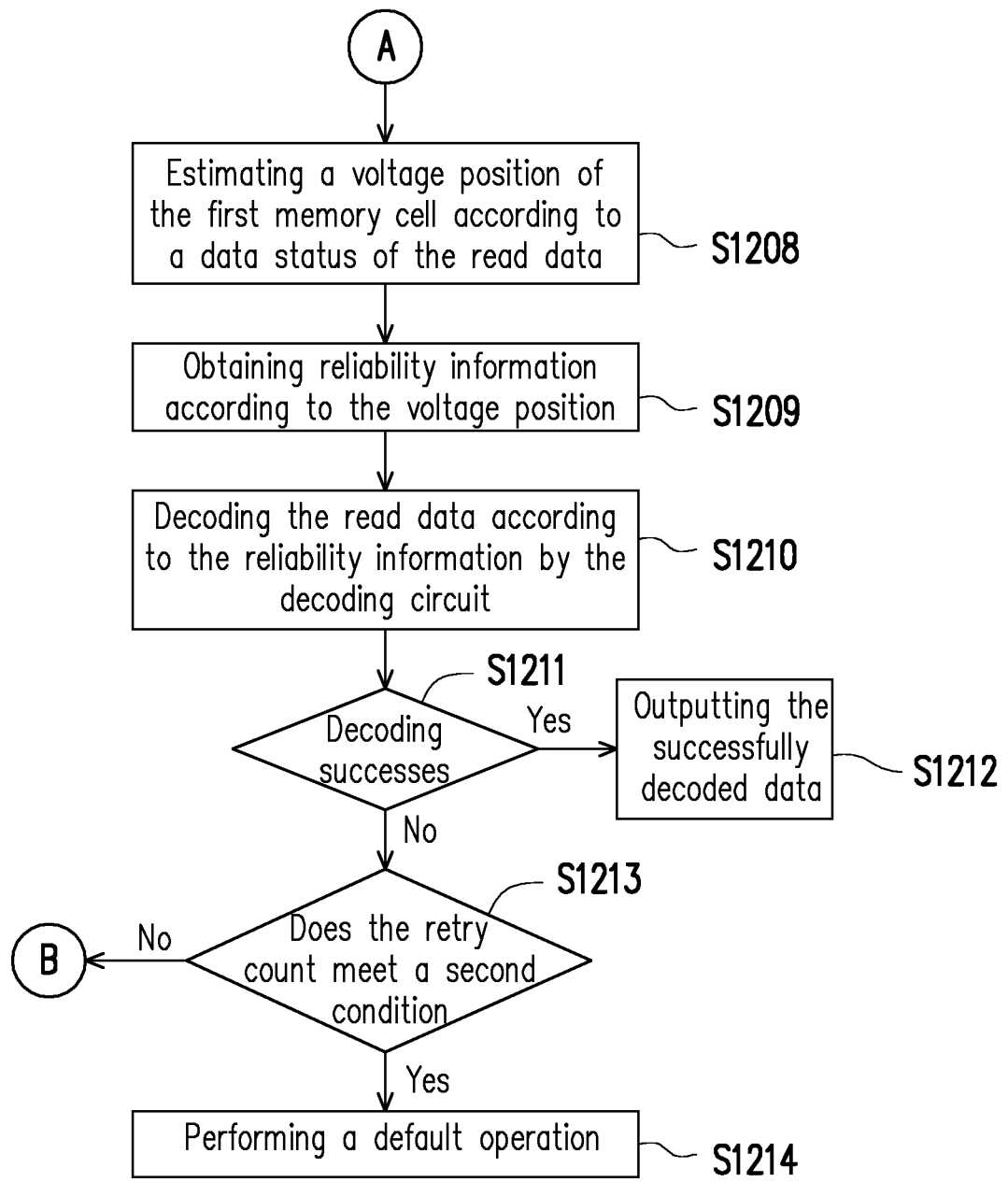

FIG. 12A and FIG. 12B are flow charts of a memory control method according to an exemplary embodiment of the disclosure.

Referring to FIG. 12A, in step S1201, data is read from a first memory cell by a RVL. In step S1202, the data is decoded by a decoding circuit. In step S1203, it is determined whether the decoding is successful. If the decoding is successful, in step S1204, the successfully decoded data is output. If the decoding is unsuccessful, in step S1205, the RVL is adjusted. In step S1206, a retry count is updated. It is noted that, the execution order of the steps S1205 and S1206 may be reversed or the steps S1205 and S1206 may be simultaneously performed, and the present disclosure is not limited thereto. In step S1207, it is determined whether the retry count meets a first condition. If retry count does not meet the first condition, after the step S1207, the method may back to the step S1201.

Referring to FIG. 12B, if the retry count meets the first condition, in step S1208, a voltage position of the first memory cell is evaluated according to the data status of the read data. In step S1209, reliability information is dynamically obtained according to the voltage position. In step S1210, the read data is decoded according to the reliability information by the decoding circuit. In step S1211, it is determined whether the decoding is successful. If the decoding is successful, in step S1212, the successfully decoded data is output. If the decoding is unsuccessful, in step S1213, it is determined whether the retry count meets a second condition. If the retry count does not meet the second condition, after the step S1213, the method may back to steps S1205 and/or S1206. If the retry count meets the second condition, in step S1214, a preset operation is performed. For example, the preset operation may include any advanced error handling operations.

It is noted that, in the exemplary embodiment of FIG. 11, the steps S1101-S1105 may be considered as being performed in the retry mode. In the exemplary embodiment of FIG. 12, proceeding to steps S1205 and/or S1206 may be considered as entering the retry mode, and proceeding to step S1214 may be considered as leaving or terminating the retry mode.

However, the steps in FIGS. 11, 12A, and 12B have been described in detail above, and will not be described again. It is noted that, the steps in FIG. 11, FIG. 12A, and FIG. 12B may be implemented as a plurality of program codes or circuits, and the present disclosure is not limited thereto. In addition, the methods of FIG. 11, FIG. 12A, and FIG. 12B may be used in combination with the above exemplary embodiments, or may be used alone, and the present disclosure is not limited thereto.

Based on the above, after reading the first PU by multiple RVLs and decoding the read data respectively, the data status of the read data may be used to obtain and/or update the reliability information corresponding to the first memory cell in the first PU, so as to reflect the voltage position of the first memory cell. In addition, in an exemplary embodiment, in the retry mode, after reading the first PU by using a preset number of the RVLs, the data status of the read data may be used to obtain and/or update the reliability information corresponding to the first memory cell in the first PU and a decoding operation may be performed according to the updated reliability information. Comparing to the traditional decoding operation which needs to leave the retry mode to obtain soft bit information of memory cells, the exemplary embodiments of the present disclosure may effectively improve the decoding capability of the decoding circuit and/or improve the performance of the memory storage device.

The previously described exemplary embodiments of the present disclosure have the advantages aforementioned, wherein the advantages aforementioned not required in all versions of the disclosure.

It may be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory control method, for a rewritable non-volatile memory module, wherein the rewritable non-volatile memory module comprises a plurality of memory cells, and the memory control method comprises:
   reading first data from a first memory cell among the memory cells by a first read voltage level;
   decoding the first data by a decoding circuit;
   reading second data from the first memory cell by a second read voltage level which is different from the first read voltage level;
   obtaining reliability information corresponding to the first memory cell according to a first data status of the first data and a second data status of the second data, wherein the first data status and the second data status reflect that a first bit value of the first data is different from a second bit value of the second data;
   decoding the second data by the decoding circuit according to the reliability information;
   reading third data from the first memory cell by a fourth read voltage level which is different from the first read voltage level and the second read voltage level; and
   updating the reliability information according to the fourth read voltage level in response to that a voltage gap between the fourth read voltage level and a voltage position of the first memory cell is smaller than a voltage gap between the first read voltage level and the voltage position of the first memory cell.

2. The memory control method according to claim 1, wherein a step of obtaining the reliability information corresponding to the first memory cell according to the first data status of the first data and the second data status of the second data comprises:
   evaluating the voltage position of the first memory cell according to the first data status and the second data status; and
   obtaining the reliability information corresponding to the first memory cell according to the voltage position.

3. The memory control method according to claim 2, wherein a step of obtaining the reliability information corresponding to the first memory cell according to the voltage position comprises:
   obtaining the reliability information corresponding to the first memory cell according to a voltage gap between the first read voltage level and a third read voltage level, wherein a read error rate corresponding to the third read voltage level is lower than a read error rate corresponding to the first read voltage level.

4. The memory control method according to claim 3, wherein a step of obtaining the reliability information corresponding to the first memory cell according to the voltage gap between the first read voltage level and the third read voltage level comprises:
   obtaining reliability information corresponding to the third read voltage level; and
   obtaining the reliability information corresponding to the first memory cell according to the voltage gap and the reliability information corresponding to the third read voltage level.

5. The memory control method according to claim 1, further comprises:
   reading initial data from the first memory cell by a default read voltage level;
   decoding the initial data by the decoding circuit;
   entering a retry mode after the decoding of the initial data is failed;
   sending a first read command sequence which instructs a reading of the first data from the first memory cell by the first read voltage level in the retry mode; and
   sending a second read command sequence which instructs a reading of the second data from the first memory cell by the second read voltage level in the retry mode.

6. The memory control method according to claim 5, further comprises:
   updating a retry count corresponding to the sending of the first read command sequence.

7. The memory control method according to claim 6, further comprises:
   determining whether the retry count meets a first condition, and an operation of obtaining the reliability information corresponding to the first memory cell is only performed after the retry count meets the first condition; and
   terminating the retry mode after the retry count meets a second condition.

8. The memory control method according to claim 5, wherein a first voltage gap is presented between two neighboring voltage levels among the default read voltage level, the first read voltage level and the second read voltage level, a second voltage gap is presented between another two neighboring voltage levels among the default read voltage level, the first read voltage level and the second read voltage level, and the first voltage gap is different from the second voltage gap.

9. The memory control method according to claim 1, wherein the voltage position of the first memory cell is located between the first read voltage level and the second read voltage level.

10. A memory storage device, comprising:
    a connection interface unit, configured to connect a host system;
    a rewritable non-volatile memory module which comprises a plurality of memory cells; and
    a memory control circuit unit, coupled to the connection interface unit and the rewritable non-volatile memory module,
    wherein the memory control circuit unit is configured to send a first read command sequence which instructs a reading of first data from a first memory cell among the memory cells by a first read voltage level,
    the memory control circuit unit is further configured to decode the first data,
    the memory control circuit unit is further configured to send a second read command sequence which instructs a reading of second data from the first memory cell by a second read voltage level which is different from the first read voltage level,
    the memory control circuit unit is further configured to obtain reliability information corresponding to the first memory cell according to a first data status of the first data and a second data status of the second data, wherein the first data status and the second data status reflect that a first bit value of the first data is different from a second bit value of the second data, the memory control circuit unit is further configured to decode the second data according to the reliability information, the memory control circuit unit is further configured to send a fourth read command sequence which instructs a reading of third data from the first memory cell by a fourth read voltage level which is different from the first read voltage level and the second read voltage level, and the memory control circuit unit is further configured to update the reliability information according to the fourth read voltage level in response to that a voltage gap between the fourth read voltage level and a voltage position of the first memory cell is smaller than a voltage gap between the first read voltage level and the voltage position of the first memory cell.

11. The memory storage device according to claim 10, wherein an operation of obtaining the reliability information corresponding to the first memory cell according to the first data status of the first data and the second data status of the second data by the memory control circuit unit comprises:

evaluating the voltage position of the first memory cell according to the first data status and the second data status; and obtaining the reliability information corresponding to the first memory cell according to the voltage position.

12. The memory storage device according to claim 11, wherein an operation of obtaining the reliability information corresponding to the first memory cell according to the voltage position by the memory control circuit unit comprises:

obtaining the reliability information corresponding to the first memory cell according to a voltage gap between the first read voltage level and a third read voltage level, wherein a read error rate corresponding to the third read voltage level is lower than a read error rate corresponding to the first read voltage level.

13. The memory storage device according to claim 12, wherein an operation of obtaining the reliability information corresponding to the first memory cell according to the voltage gap between the first read voltage level and the third read voltage level by the memory control circuit unit comprises:

obtaining reliability information corresponding to the third read voltage level; and obtaining the reliability information corresponding to the first memory cell according to the voltage gap and the reliability information corresponding to the third read voltage level.

14. The memory storage device according to claim 10, wherein the memory control circuit unit is further configured to:

send a third read command sequence which instructs a reading of initial data from the first memory cell by a default read voltage level;

decode the initial data;

enter a retry mode after the decoding of the initial data is failed;

send the first read command sequence in the retry mode; and send the second read command sequence in the retry mode.

15. The memory storage device according to claim 14, wherein the memory control circuit unit is further configured to update a retry count corresponding to the sending of the first read command sequence.

16. The memory storage device according to claim 15, wherein the memory control circuit unit is further configured to determine whether the retry count meets a first condition, and an operation of obtaining the reliability information corresponding to the first memory cell is only performed after the retry count meets the first condition, and the memory control circuit unit is further configured to terminate the retry mode after the retry count meets a second condition.

17. The memory storage device according to claim 14, wherein a first voltage gap is presented between two neighboring voltage levels among the default read voltage level, the first read voltage level and the second read voltage level, a second voltage gap is presented between another two neighboring voltage levels among the default read voltage level, the first read voltage level and the second read voltage level, and the first voltage gap is different from the second voltage gap.

18. The memory storage device according to claim 10, wherein the voltage position of the first memory cell is located between the first read voltage level and the second read voltage level.

19. A memory control circuit unit for controlling a rewritable non-volatile memory module comprising a plurality of memory cells, and the memory control circuit unit comprising:

a host interface configured to couple to a host system;

a memory interface, configured to couple to the rewritable non-volatile memory module;

a decoding circuit; and a memory management circuit, coupled to the host interface, the memory interface and the decoding circuit, wherein the memory management circuit is configured to send a first read command sequence which instructs a reading of first data from a first memory cell among the memory cells by a first read voltage level, the decoding circuit is configured to decode the first data, the memory management circuit is further configured to send a second read command sequence which instructs a reading of second data from the first memory cell by a second read voltage level which is different from the first read voltage level, the memory management circuit is further configured to obtain reliability information corresponding to the first memory cell according to a first data status of the first data and a second data status of the second data, wherein the first data status and the second data status reflect that a first bit value of the first data is different from a second bit value of the second data, the decoding circuit is further configured to decode the second data according to the reliability information, the memory management circuit is further configured to send a fourth read command sequence which instructs a reading of third data from the first memory cell by a fourth read voltage level which is different from the first read voltage level and the second read voltage level, and the memory management circuit is further configured to update the reliability information according to the fourth read voltage level in response to that a voltage gap between the fourth read voltage level and a voltage position of the first memory cell is smaller than a voltage gap between the first read voltage level and the voltage position of the first memory cell.

20. The memory control circuit unit according to claim 19, wherein an operation of obtaining the reliability information corresponding to the first memory cell according to the first data status of the first data and the second data status of the second data by the memory management circuit comprises:

evaluating the voltage position of the first memory cell according to the first data status and the second data status; and obtaining the reliability information corresponding to the first memory cell according to the voltage position.

21. The memory control circuit unit according to claim 20, wherein an operation of obtaining the reliability information corresponding to the first memory cell according to the voltage position by the memory management circuit comprises:

obtaining the reliability information corresponding to the first memory cell according to a voltage gap between the first read voltage level and a third read voltage level, wherein a read error rate corresponding to the third read voltage level is lower than a read error rate corresponding to the first read voltage level.

22. The memory control circuit unit according to claim 21, wherein an operation of obtaining the reliability information corresponding to the first memory cell according to the voltage gap between the first read voltage level and the third read voltage level by the memory management circuit comprises:

obtaining reliability information corresponding to the third read voltage level; and obtaining the reliability information corresponding to the first memory cell according to the voltage gap and the reliability information corresponding to the third read voltage level.

23. The memory control circuit unit according to claim 19, wherein the memory management circuit is further configured to send a third read command sequence which instructs a reading of initial data from the first memory cell by a default read voltage level, the decoding circuit is further configured to decode the initial data, and the memory management circuit is further configured to enter a retry mode and send the first read command sequence and the second read command sequence in the retry mode after the decoding of the initial data is failed.

24. The memory control circuit unit according to claim 23, wherein the memory management circuit is further configured to update a retry count corresponding to the sending of the first read command sequence.

25. The memory control circuit unit according to claim 24, wherein the memory management circuit is further configured to determine whether the retry count meets a first condition, and an operation of obtaining the reliability information corresponding to the first memory cell is only performed after the retry count meets the first condition, and the memory management circuit is further configured to terminate the retry mode after the retry count meets a second condition.

26. The memory control circuit unit according to claim 23, wherein a first voltage gap is presented between two neighboring voltage levels among the default read voltage level, the first read voltage level and the second read voltage level, a second voltage gap is presented between another two neighboring voltage levels among the default read voltage level, the first read voltage level and the second read voltage level, and the first voltage gap is different from the second voltage gap.

27. The memory control circuit unit according to claim 19, wherein the voltage position of the first memory cell is located between the first read voltage level and the second read voltage level.

* * * * *